(12) United States Patent
Kawase

(10) Patent No.: US 6,716,697 B2
(45) Date of Patent: Apr. 6, 2004

(54) METHOD OF MANUFACTURING SEMICONDUCTOR DEVICE HAVING CAPACITOR

(75) Inventor: Yusuke Kawase, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/331,656

(22) Filed: Dec. 31, 2002

(65) Prior Publication Data

US 2004/0009641 A1 Jan. 15, 2004

(30) Foreign Application Priority Data

Jul. 12, 2002 (JP) ................................... P2002-203511

(51) Int. Cl.$^7$ .......................................... H01L 21/8242
(52) U.S. Cl. ....................................... 438/256; 438/970
(58) Field of Search ................................. 438/210, 241, 438/253, 256, 396, 399, 634, 675, 970

(56) References Cited

U.S. PATENT DOCUMENTS 5,817,555 A * 10/1998 Cho ............................ 438/253
6,037,213 A * 3/2000 Shih et al. ................... 438/634
6,459,112 B1 * 10/2002 Tsuboi et al. ................ 257/296

FOREIGN PATENT DOCUMENTS

JP 11-103025 4/1999

* cited by examiner

*Primary Examiner*—Chandra Chaudhari
(74) *Attorney, Agent, or Firm*—Oblon, Spivak, McClelland, Maier & Neustadt, P.C.

(57) ABSTRACT

Provided is a semiconductor device manufacturing method in which the numbers of photolithography and anisotropic dry etching processes are reduced to simplify the manufacturing steps; and it is avoided that the presence of an etching stopper film complicates the manufacturing steps in a region where no capacitor is formed, and also causes malfunction in a contact plug. Specifically, an anisotropic dry etching using a resist mask (RM2) is performed to form an opening (OP3) extending through at least an interlayer insulating film (5). Even after an etching stopper film (4) is exposed to the bottom part of the opening (OP3), the anisotropic dry etching is continued, using the etching stopper film (4) as etching mask, in order to form a contact hole (CH1) extending through an interlayer insulating film (3) to source/drain regions (11, 13). Therefore, the opening (OP3) and contact hole (CH1) are obtainable at a time in the same etching step.

7 Claims, 26 Drawing Sheets

F I G . 2 1 (BACKGROUND ART)

METHOD OF MANUFACTURING SEMICONDUCTOR DEVICE HAVING CAPACITOR

BACKGROUND OF THE INVENTION

1. Field of the Invention

The present invention relates to a semiconductor device manufacturing method and, in particular, to a method of manufacturing a semiconductor device in which a region having a capacitor such as a memory cell part and a region having no capacitor such as a logic circuit are disposed on the same semiconductor substrate.

2. Description of the Background Art

In semiconductor devices, specifically dynamic RAMs (DRAMs), the number of manufacturing steps and manufacturing time are increasing with increasing the tendency of high integration and large capacity. As a solution, it is the most important to simplify the manufacturing steps.

A conventional method of manufacturing a DRAM having a cylindrical capacitor will be described by using FIGS. 16 to 24, which are sectional views showing a sequence of manufacturing steps. FIGS. 16 to 24 only partially show the configuration of the DRAM, and the number of the individual elements etc. are not to be construed as a limiting value.

FIG. 16 is a partial sectional view showing a DRAM 90 having a memory cell region MR and a peripheral circuit region LR that is formed in the periphery of the memory cell region MR and does not have any capacitor such as a logic circuit, sense amplifier, and decoder. The final configuration of the DRAM 90 is given in FIG. 24 showing the final step.

In the step of FIG. 16, a silicon substrate 1 is prepared. In a main surface of the silicon substrate, an element isolation insulating film 2 is selectively formed to define the memory cell region MR and peripheral circuit region LR, and also define an active region AR in the memory cell region MR and peripheral circuit region LR, respectively.

Subsequently, by a conventional technique, the following components are formed to obtain an MOS transistor in the active region AR of the memory cell region MR. That is, source/drain regions 11, 12, and 13 are selectively formed in the substrate surface. A gate insulating film 21 is formed so as to extend above between the ends of the source/drain regions 11 and 12, and between the ends of the source/drain regions 12 and 13. A gate electrode 22 is disposed on the gate insulating film 21. Further, a sidewall insulating film 23 is formed so as to cover the side surface of the game electrode 22.

On the other hand, the following components are formed to obtain an MOS transistor in the active region AR of the peripheral circuit region LR. That is, source/drain regions 14 and 15 are selectively formed in the substrate surface. A gate insulating film 31 is formed so as to extend above between the ends of the source/drain regions 14 and 15. A gate electrode 32 is disposed on the gate insulating film 31. Further, a sidewall insulating film 33 is formed so as to cover the side surface of the game electrode 32.

Then, an interlayer insulting film 3 is formed, such as by the use of a silicon oxide film, so as to cover the memory cell region MR and peripheral circuit region LR by CVD (chemical vapor deposition) method, for example.

In the memory cell region MR, a bit line 42 is selectively formed in the interlayer insulating film 3 overlying the source/drain region 12. The bit line 42 is electrically connected via a contact plug 41 to the source/drain region 12.

In the step of FIG. 17, a resist is applied to the entire surface of the interlayer insulating film 3, and a resist pattern for forming a contact plug is transferred to form a resist mask RM11 by photolithography technique. In FIG. 17, the resist mask RM11 has a resist pattern for disposing a contact hole CH11 only in the interlayer insulating film 3 of the memory cell region MR.

Thereafter, an anisotropic dry etching using the resist mask RM11 is performed to form the contact hole CH11 extending through the interlayer insulating film 3 to the source/drain regions 11 and 13.

The resist mask RM11 is then removed. In the step of FIG. 18, for example by CVD method, a polysilicon film is formed over the entire surface of the interlayer insulating film 3 in order to fill in the contact hole CH11. The polysilicon film on the interlayer insulating film 3 is then removed by CMP (chemical mechanical polishing), for example, and a contact plug 51 serving as an electrode plug is formed in the contact hole CH11.

Thereafter, an etching stopper film 4 is formed, such as by the use of a silicon nitride film, over the entire surface of the interlayer insulating film 3.

In the step of FIG. 19, an interlayer insulating film 5 is formed, such as by the use of a silicon oxide film, over the entire surface of the etching stopper film 4. A resist is applied over the entire surface of the interlayer insulating film 5. A resist pattern for forming a capacitor is transferred to form a resist mask RM12 by photolithography technique. This resist pattern has such a pattern that is opened at a portion corresponding to above of the contact plug 51.

In the step of FIG. 20, an anisotropic dry etching using the resist mask RM12 is performed to form a cylindrical opening OP11 extending through the interlayer insulating film 5 and etching stopper film 4 to the interlayer insulating film 3. The opening OP11 is disposed so as to correspond to a region for forming the contact plug 51, and the top surface of the contact plug 51 is exposed to the bottom part of the opening OP11.

When performing etching to the interlayer insulating film 5, the etching condition is selected such that the etching is stopped at the etching stopper film 4.

The opening OP11 is formed so as to match the contour of a cylindrical capacitor to be formed later, in order that the cylindrical capacitor is formed within the opening OP11.

The resist mask RM12 is then removed. In the step of FIG. 21, a capacitor lower electrode 52 is obtained by forming a polysilicon film along the inner wall of the opening OP11 by CVD method, for example.

Thereafter, a capacitor dielectric film 53 is formed along the surface of the capacitor lower electrode 52. Further, a capacitor upper electrode 54 is obtained by forming for example a polysilicon film extending from the upper surface of the capacitor dielectric film 53 to above the interlayer insulating film 5 around the opening OP11. This results in the cylindrical capacitor CP, which is also called "interior type."

In the step of FIG. 22, an interlayer insulating film 6 is formed, such as by the use of a silicon oxide film, over the entire surface of the memory cell region MR and peripheral circuit region LR.

In the step of FIG. 23, in the memory cell region MR, an anisotropic dry etching is performed to form a contact hole CH12 extending through the interlayer insulating film 6 to the capacitor upper electrode 54 overlying the interlayer insulating film 5. In the peripheral circuit region LR, an anisotropic dry etching is performed to form a contact hole CH13 extending through the interlayer insulating films 6 and 5, etching stopper film 4, and interlayer insulating film 3 to the source/drain regions 14 and 15.

In the step of FIG. 24, for example by sputtering method, the contact holes CH12 and CH13 are filled with a metal film (e.g., tungsten film), thereby to form contact plugs 61 and 71, respectively. The DRAM 90 is obtained by patterning metal wiring layers 62 and 72 such that they are connected to the contact plugs 61 and 71, respectively. Although an interlayer insulating film and wiring layer may be further disposed on the interlayer insulating film 6 in some cases, their depict and description are omitted here.

As described above, the conventional manufacturing method of the semiconductor device having the stacked capacitor requires at least two photolithography processes and a plurality of anisotropic dry etching processes in order to form the contact plug 51 as electrode plug and the cylindrical capacitor CP. Therefore, this method has the disadvantage that the manufacturing steps are complicated and the manufacturing cost is increased.

Further, as described in connection with FIG. 23, when forming the contact hole CH13 so as to reach the source/drain regions 14 and 15 in the peripheral circuit region LR, namely the region where no capacitor is formed, not only the interlayer insulating films 3, 5, and 6, but also the etching stopper film 4 is removed. At this time, since the silicon oxide film and silicon nitride film have different anisotropic dry etching conditions, it is necessary to change the etching conditions depending on the etching object. This contributes to the complicated manufacturing steps.

Furthermore, after forming the contact hole CH13, wet etching using chemicals such as hydrofluoric acid (HF) is performed to remove native oxide to be formed on the surface of the silicon substrate 1 that corresponds to the bottom surface of the contact hole CH13. At this time, the interlayer insulating films 3, 5, and 6, being silicon oxide film, are also slightly etched. On the other hand, the etching stopper film 4, being silicon nitride film, is hardly removed. As the result, the etching stopper film 4 projects like a visor in the contact hole CH13, as shown in FIG. 25.

In this state, as described in connection with FIG. 24, even if the contact hole CH13 is filled with the metal material, no metal film is formed at least immediately under the visor of the etching stopper film 4 (see FIG. 26), thus lowering the coverage. In some cases, no metal film might be formed in the lower layer than the visor of the etching stopper film 4.

SUMMARY OF THE INVENTION

It is an object of the present invention to provide a semiconductor device manufacturing method with which the numbers of photolithography and anisotropic dry etching processes are reduced to simplify the manufacturing steps, and it is avoided that the presence of an etching stopper film complicates manufacturing steps in a region where no capacitor is formed, and that the presence of the etching stopper film also causes malfunction in a contact plug.

An aspect of the present invention is intended for a method of manufacturing a semiconductor device of a multilayer structure including a circuit region having a capacitor. This method has the following steps (a) to (f). The step (a) is to form a first interlayer insulting film on a semiconductor substrate. The step (b) is to form an etching stopper film on the entire surface of the first interlayer insulating film. The step (c) is to pattern, in the circuit region having the capacitor, the etching stopper film so as to have a first opening of which opening area is approximately the same as the sectional area of a first contact plug electrically connecting a lower electrode of the capacitor and the configuration of a lower layer than the etching stopper film. The step (d) is to form a second interlayer insulating film on the etching stopper film. The step (e) is to form at a time, in the circuit region having the capacitor, a capacitor opening for defining the contour of the capacitor and a first contact hole for forming the first contact plug by removing, by an anisotropic dry etching, a predetermined region of the second interlayer insulating film including above the first opening until the etching stopper film is exposed, and continuing the etching to remove the first interlayer insulating film below the first opening. The step (f) is to form the capacitor in the capacitor opening.

The first contact hole for forming the first contact plug in the circuit region having the capacitor and the capacitor opening for forming the capacitor can be formed by performing photolithography two times and anisotropic etching two times. Therefore, the manufacturing steps can considerably be simplified to reduce the manufacturing cost.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

A-1. Manufacturing Method

A semiconductor device manufacturing method according to a first preferred embodiment will be described by using FIGS. 1 to 8, which are partial sectional views showing a sequence of manufacturing steps of a DRAM 100 having a cylindrical capacitor. FIGS. 1 to 8 merely show part of the configuration of the DRAM 100, and the number of the individual elements etc. are not to be construed as a limiting value.

Figure 6:
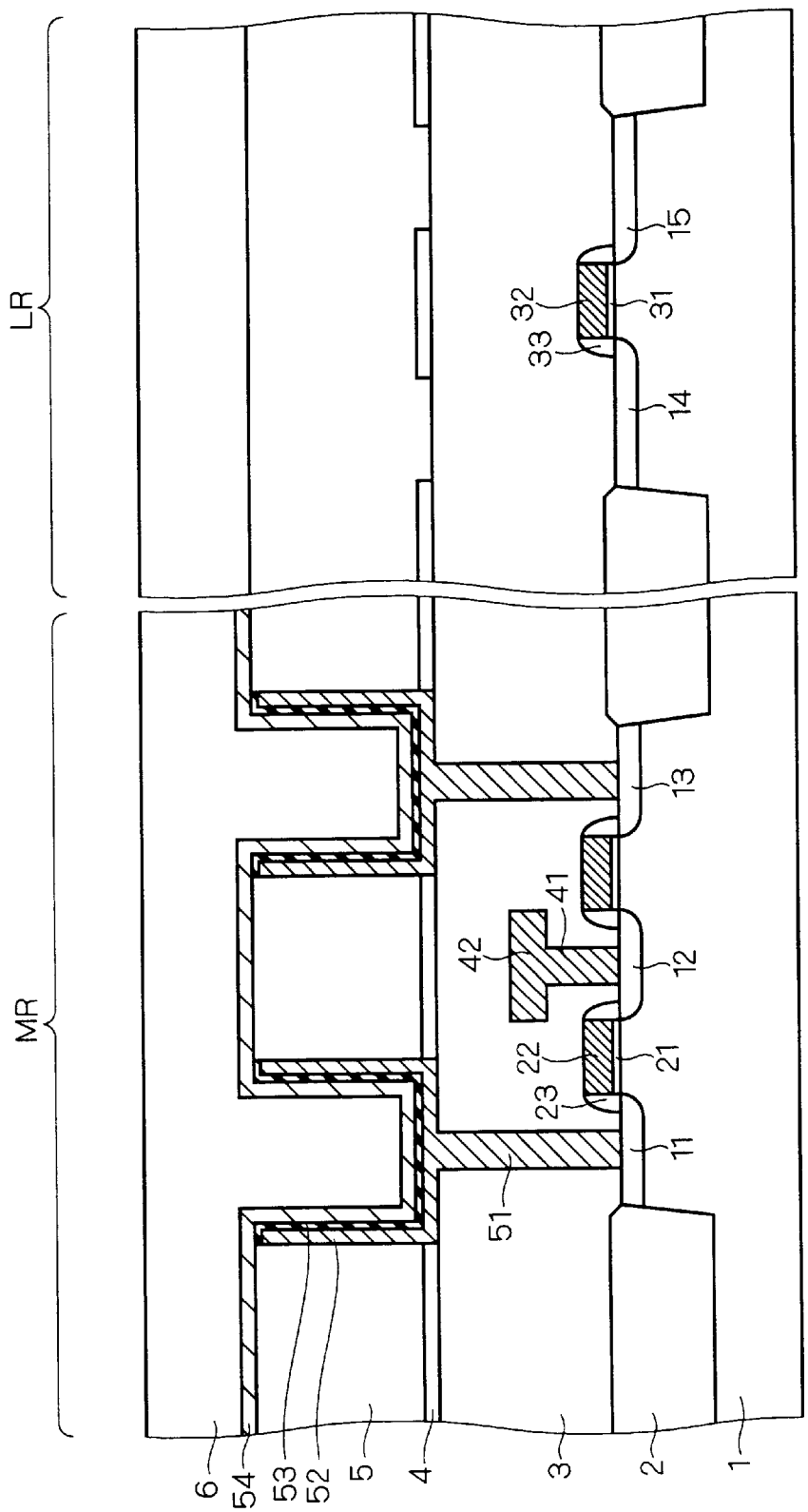
Figure 7:
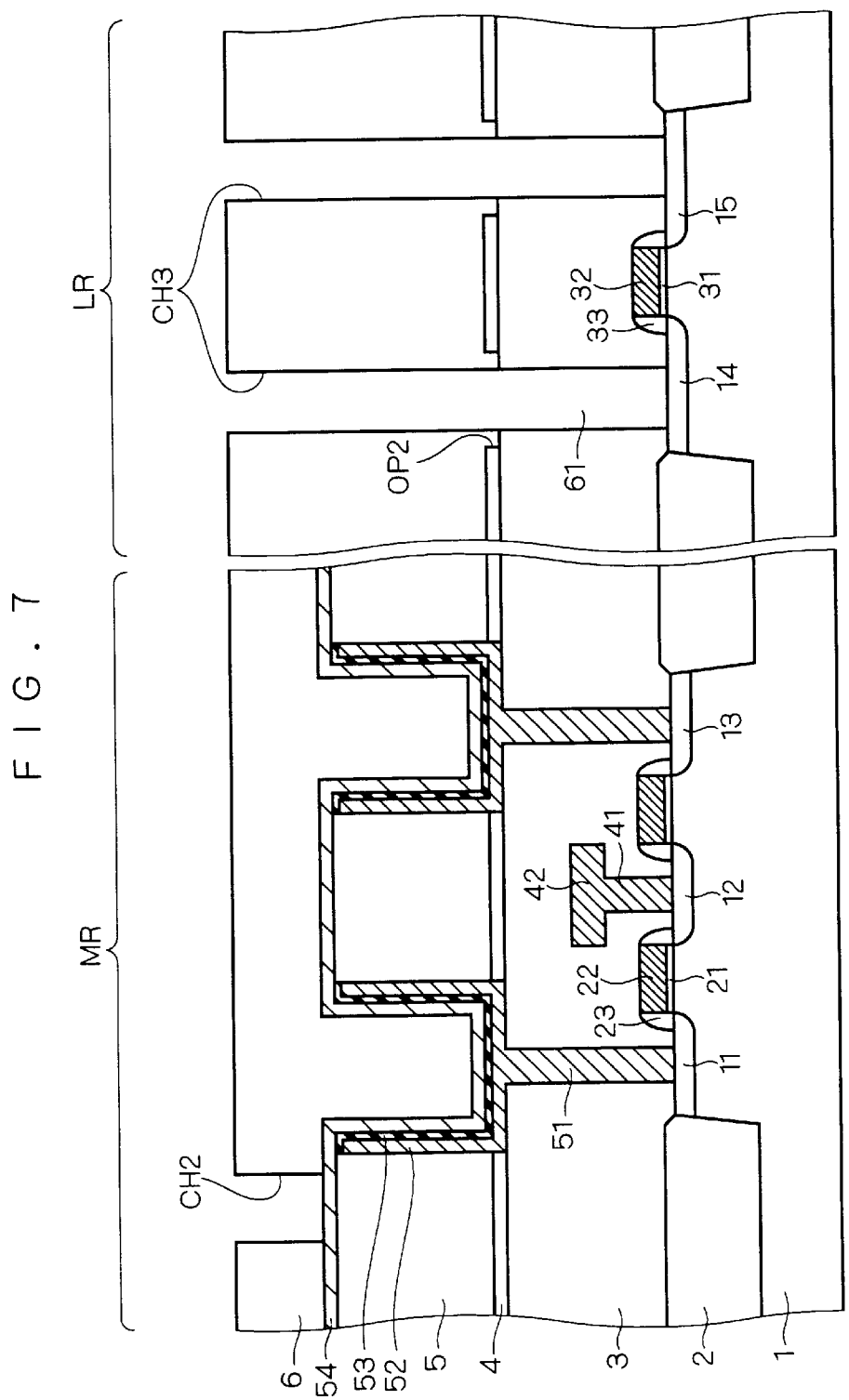
Figure 8:
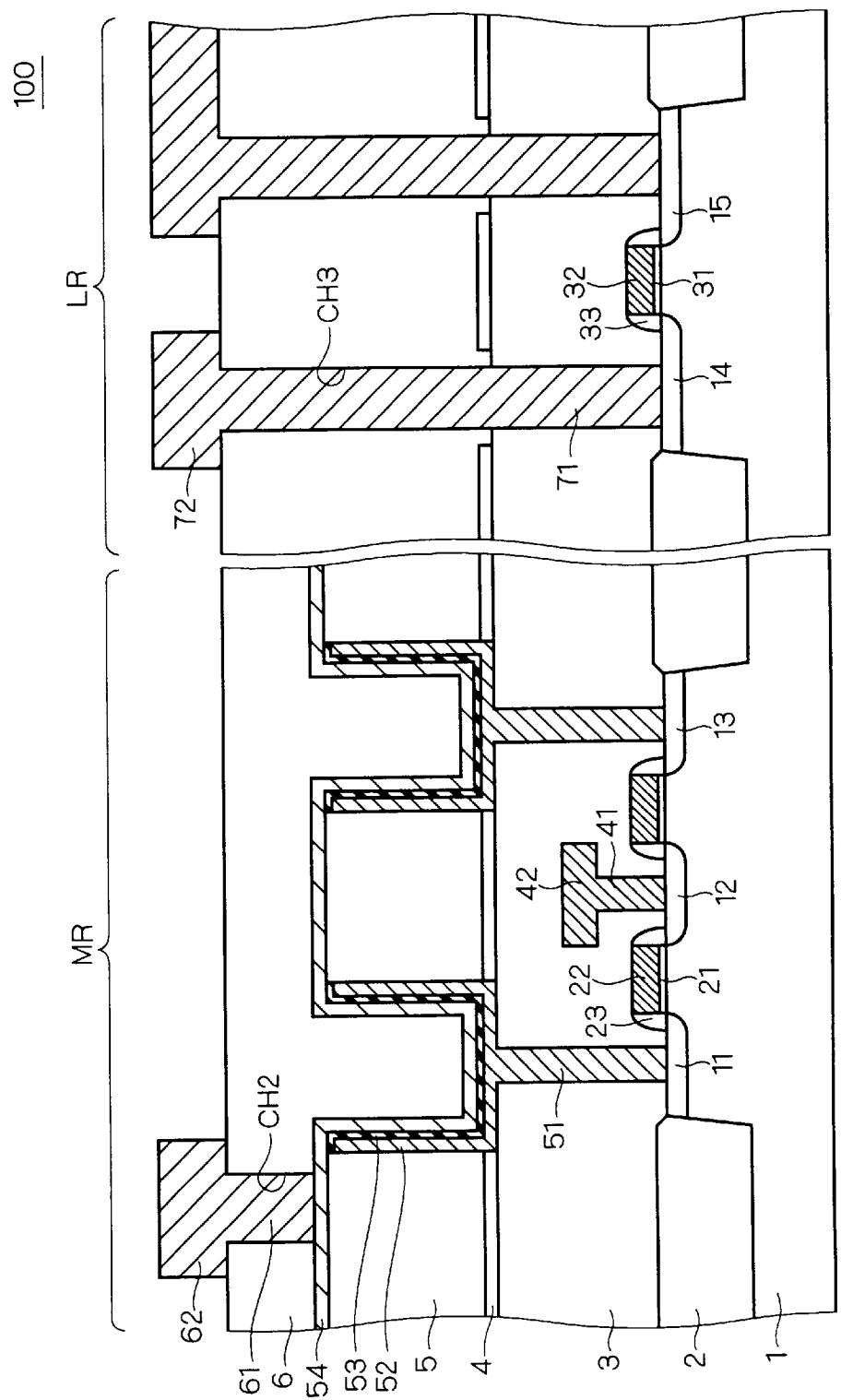

Specifically, FIGS. 1 to 8 are partial sectional views showing the DRAM 100 having a memory cell region MR and a peripheral circuit region LR that is formed in the periphery of the memory cell region MR and does not include any capacitor such as a logic circuit, sense amplifier, and decoder. The final configuration of the DRAM 100 is given in FIG. 8 showing the final step.

Figure 1:
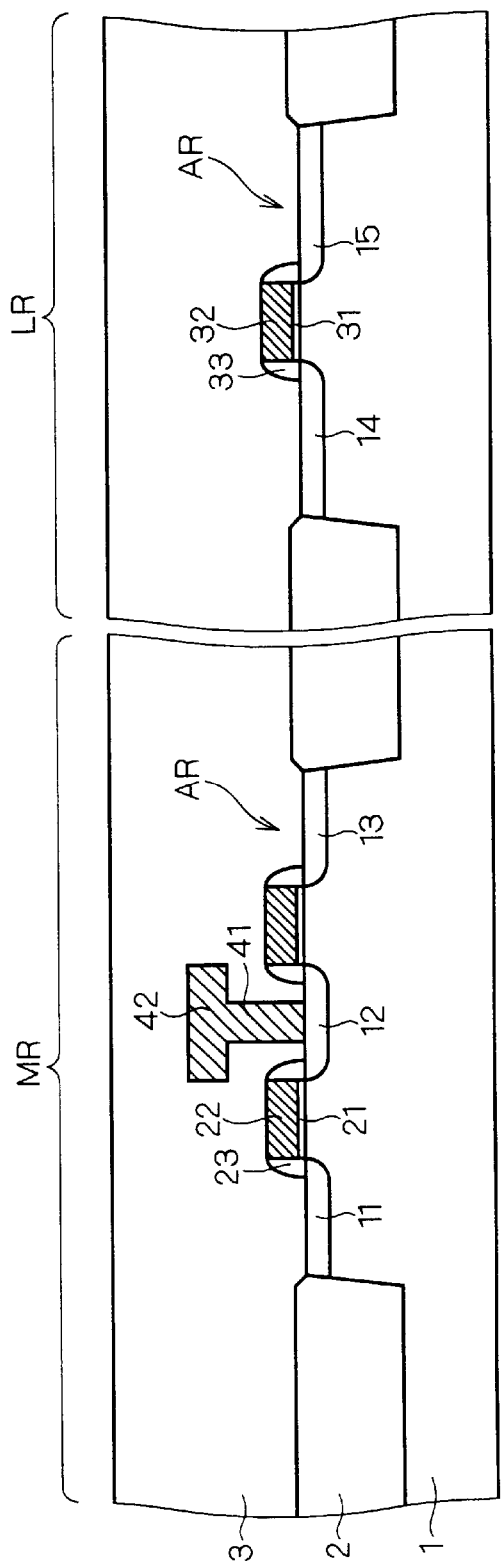
FIGS. 1 to 8 are sectional views illustrating a sequence of semiconductor device manufacturing steps according to a first preferred embodiment of the present invention.

In the step of FIG. 1, a silicon substrate 1 is prepared. In a main surface of the silicon substrate 1, an element isolation insulating film 2 is selectively formed to define the memory cell region MR and peripheral circuit region LR, and also define an active region AR in the memory cell region MR and peripheral circuit region LR, respectively.

Subsequently, by a conventional technique, the following components are formed to obtain an MOS transistor in the active region AR of the memory cell region MR. That is, source/drain regions 11, 12, and 13 are selectively formed in the substrate surface. A gate insulating film 21 is formed so as to extend above between the ends of the source/drain regions 11 and 12, and between the ends of the source/drain regions 12 and 13. A gate electrode 22 is disposed on the gate insulating film 21. Further, a sidewall insulating film 23 is formed so as to cover the side surface of the game electrode 22.

On the other hand, the following components are formed to obtain an MOS transistor in the active region AR of the peripheral circuit region LR. That is, source/drain regions 14 and 15 are selectively formed in the substrate surface. A gate insulating film 31 is formed so as to extend above between the ends of the source/drain regions 14 and 15. A gate electrode 32 is disposed on the gate insulating film 31. Further, a sidewall insulating film 33 is formed so as to cover the side surface of the gate electrode 32.

Then, an interlayer insulting film 3 is formed, such as by the use of a silicon oxide film, for example by CVD (chemical vapor deposition) method, so as to cover the memory cell region MR and peripheral circuit region LR.

In the memory cell region MR, a bit line 42 is selectively formed in the interlayer insulating film 3 overlying the source/drain region 12. The bit line 42 is electrically connected via a contact plug 41 to the source/drain region 12.

Figure 2:
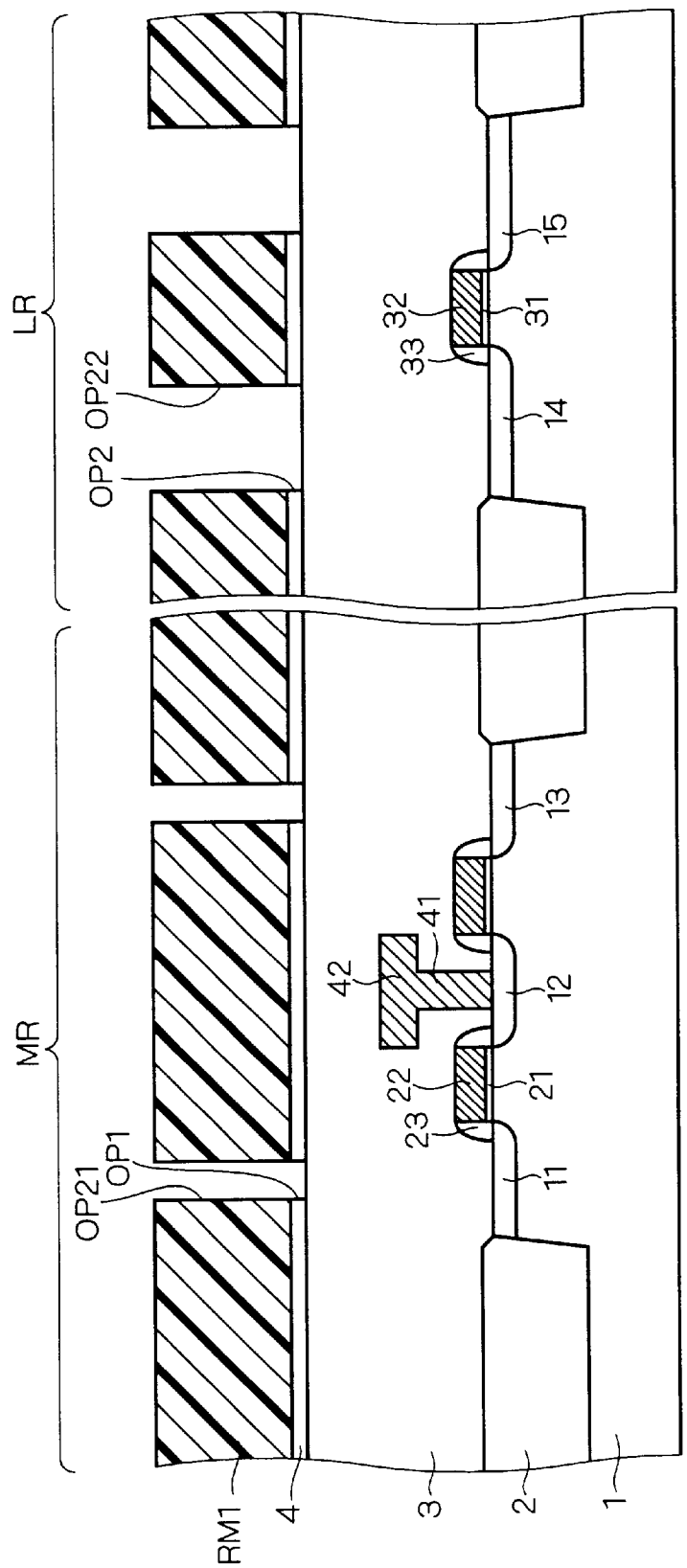

In the step of FIG. 2, an etching stopper film 4 is formed, such as by the use of a silicon nitride film, over the entire surface of the interlayer insulating film 3. As the material of this etching stopper film, instead of being restricted to the silicon nitride film, it is possible to use any material having an etching selective ratio of not less than 1 with respect to the interlayer insulating film 3 in which a cylindrical capacitor is formed in a later step.

Thereafter, a resist is applied to the entire surface of the etching stopper film 4 and, by photolithography technique, a resist pattern for forming a contact plug is transferred to form a resist mask RM1 in the memory cell region MR and peripheral circuit region LR.

The resist pattern in the peripheral circuit region LR is formed so as to have an opening OP22 that has an opening area larger than the sectional area of an actually formed contact plug.

On the other hand, the resist pattern in the memory cell region MR is formed so as to have an opening OP21 of which opening area is approximately the same as the sectional area of an actually formed contact plug.

An anisotropic dry etching using the resist mask RM1 is performed to selectively remove the etching stopper film 4, thereby forming an opening OP1 in the memory cell region MR and an opening OP2 in the peripheral circuit region LR.

The opening OP1 is disposed so as to correspond to a region for forming a contact hole that reaches source/drain regions 11 and 13 to be formed in a later step. The opening OP2 is disposed so as to correspond to a region for forming a contact hole that reaches source/drain regions 14 and 15 to be formed in a later step.

Figure 3:
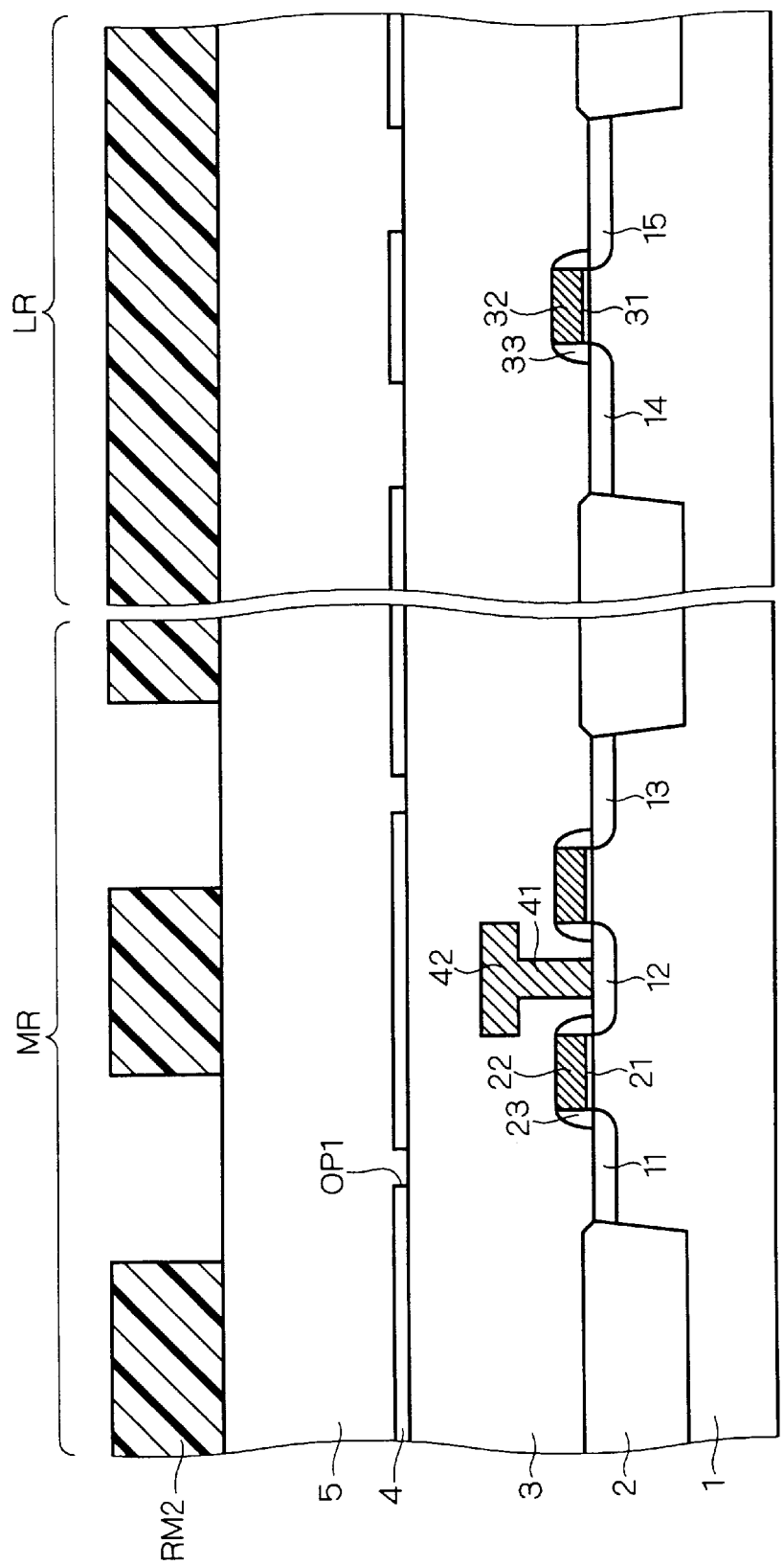

The resist mask RM1 is then removed. In the step of FIG. 3, an interlayer insulating film 5 is formed, such as by the use of a silicon oxide film, over the entire surface of the memory cell region MR and peripheral circuit region LR, for example by CVD method.

Thereafter, a resist is applied to the entire surface of the interlayer insulating film 5, and a resist pattern for forming a capacitor is transferred to form a resist mask RM2 by photolithography technique. This resist pattern has such a pattern that is opened at a portion corresponding to above of the opening OP1 disposed in the etching stopper film 4.

Figure 4:
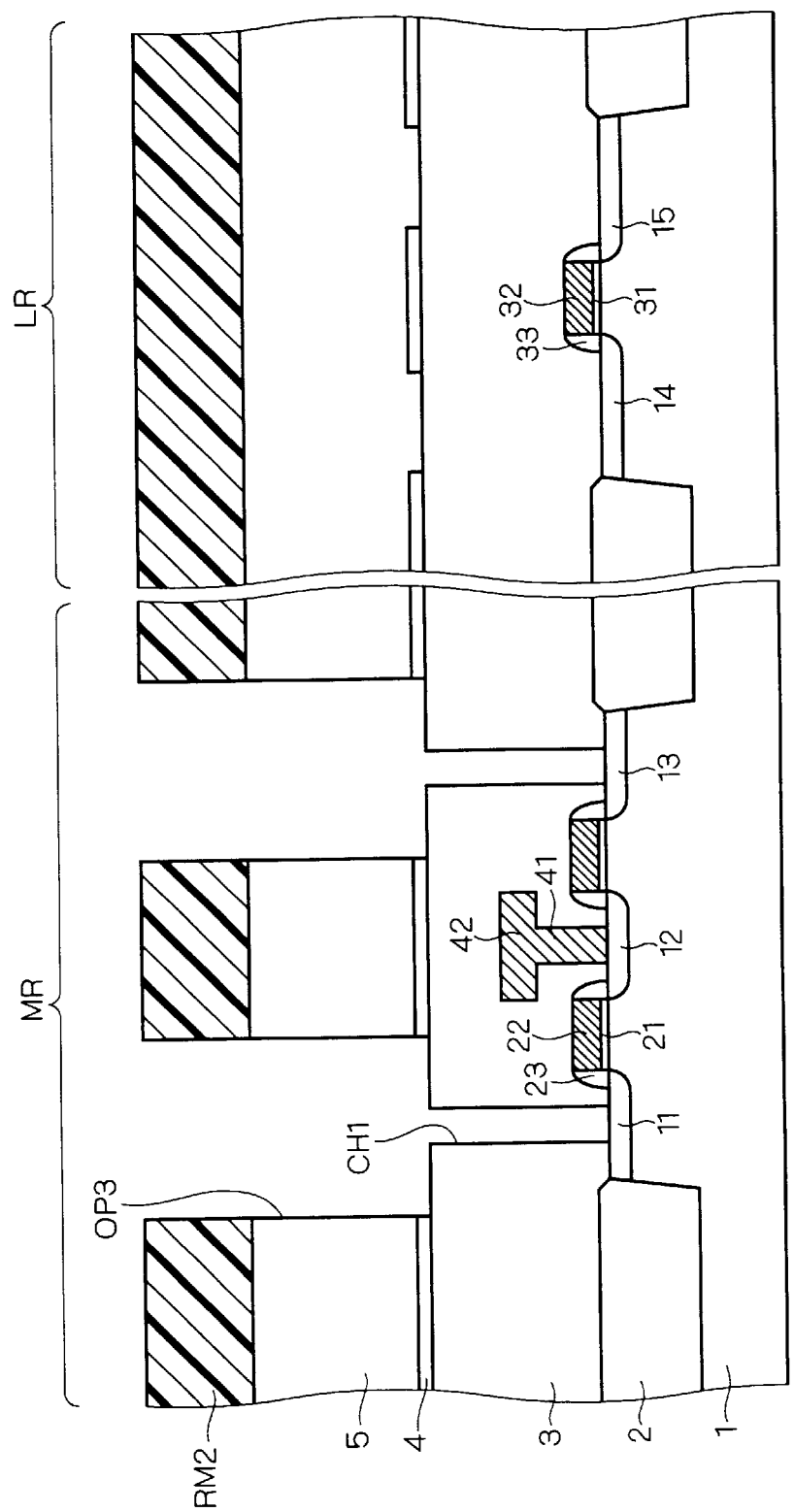

In the step of FIG. 4, an anisotropic dry etching using the resist mask RM2 is performed to form a cylindrical opening OP3 (i.e., a capacitor opening) extending through at least the interlayer insulating film 5. The opening OP3 is formed so as to match the contour of a cylindrical capacitor to be formed later, in order that the cylindrical capacitor is formed within the opening OP3.

Even after the etching stopper film 4 is exposed to the bottom part of the opening OP3, the anisotropic dry etching is continued to apply the etching to the interlayer insulating film 3 underlying the opening OP1 disposed in the etching stopper film 4.

That is, the opening OP3 and contact hole CH1 can be obtained at a time in the same etching step by forming the contact hole CH1 extending through the interlayer insulating film 3 to the source/drain regions 11 and 13 by using the etching stopper film 4 as etching mask.

Based on the etching selective ratio to the interlayer insulating film 3, and the thickness of the interlayer insulating film 3, the thickness of the etching stopper film 4 is set such that the etching stopper film 4 is not completely removed until at least the contact hole CH1 reaches the main surface of the silicon substrate 1. The etching stopper film 4 may remain at the bottom part of the opening OP3, or it may be removed completely. In either case, the etching stopper film 4 is to define the bottom surface position of the opening OP3. Following is the case where the etching stopper film 4 is completely removed.

Figure 5:
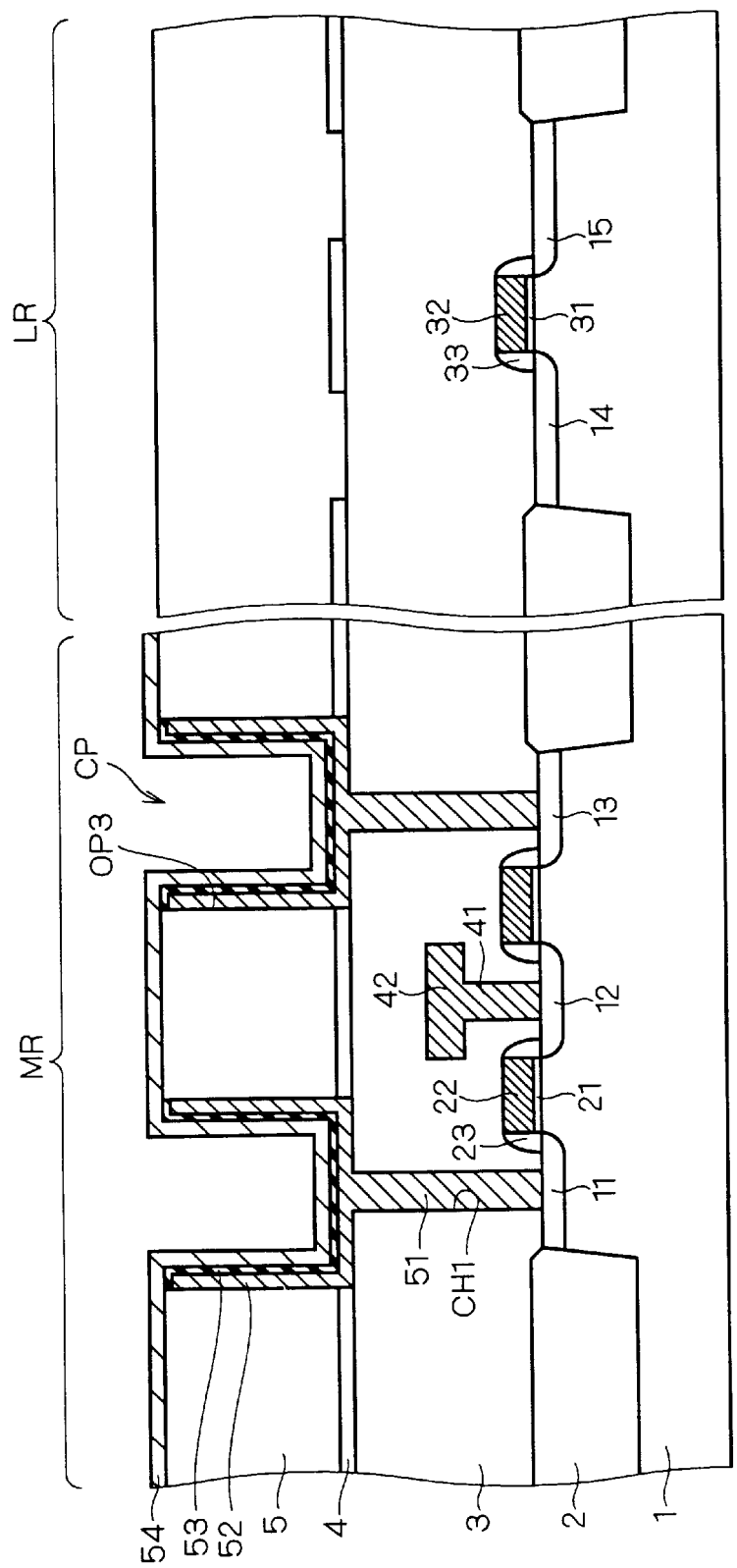

The resist mask RM2 is then removed. In the step of FIG. 5, for example by CVD method, a polysilicon film is formed so as to cover the inner wall of the opening OP3 and fill in the contact hole CH1. At the same time a capacitor lower electrode 52 is formed, there is formed a contact plug 51 (electrode plug) that electrically connects between the capacitor lower electrode 52 and source/drain regions 11, 13.

As the material of the capacitor lower electrode 52 and contact plug 51, instead of being restricted to the silicon nitride film, any conductive material (conductor film) is usable.

Then, a capacitor dielectric film 53 is formed along the surface of the capacitor lower electrode 52. Further, a capacitor upper electrode 54 is obtained by forming, for example, a polysilicon film extending from the upper surface of the capacitor dielectric film 53 to above the interlayer insulating film 5 around the opening OP11. As the result, the cylindrical capacitor CP, which is also called "interior type", is formed in the memory cell region MR.

In the step of FIG. 6, an interlayer insulating film 6 is formed, such as by the use of a silicon oxide film, over the entire surface of the memory cell region MR and peripheral circuit region LR. For example by CMP method, planarization is performed such that the main surface of the interlayer insulating film 6 is located at the same height between the memory cell region MR and peripheral circuit region LR.

In the step of FIG. 7, in the memory cell region MR, an anisotropic dry etching is performed to form a contact hole CH2 extending through the interlayer insulating film 6 to the capacitor upper electrode 54 overlying the interlayer insulating film 5. In the peripheral circuit region LR, an anisotropic dry etching is performed to form a contact hole CH3 extending through the interlayer insulating films 6, 5, and 3 to the source/drain regions 14 and 15.

The contact hole CH3 is disposed at a portion corresponding to the opening OP2 of the etching stopper film 4. In addition, the opening area of the opening OP2 is larger than the sectional area of the actually formed contact plug, namely the sectional area of the contact hole CH3, as described above. Therefore, when forming the contact hole CH3, it is unnecessary to etch the etching stopper film 4, and only the interlayer insulating films 6, 5, and 3, being silicon oxide film, are subjected to etching. This omits the operation of changing etching conditions on the way.

In the step of FIG. 8, for example by sputtering method, the contact holes CH2 and CH3 are filled with a conductive film such as a metal film (a multilayer film consisting of a barrier metal film, such as by the use of TiN, and a tungsten film), thereby forming contact plugs 61 and 71, respectively. The DRAM 100 is obtained by patterning metal wiring layers 62 and 72 such that they are connected to the contact plugs 61 and 71, respectively.

Although an interlayer insulating film and wiring layer may be further disposed on the interlayer insulating film 6 in some cases, their depict and description are omitted here.

A-2. Operations and Effects

As stated above, with the manufacturing method of the first preferred embodiment, the contact hole CH1 for forming the contact plug 51 and the opening OP1 for forming the capacitor CP in the memory cell region MR can be formed by performing photolithography two times and anisotropic etching two times. In addition, the contact plug 51 and capacitor lower electrode 52 can be formed in one film formation process by CVD method. Therefore, the manufacturing steps can considerably be simplified to reduce the manufacturing cost.

Further, when forming the contact hole CH3 in the peripheral circuit region LR, it is unnecessary to etch the etching stopper film 4, and only the interlayer insulating films 6, 5, and 3, being silicon oxide film, are subjected to etching. This eliminates the operation of changing etching conditions on the way, so that the manufacturing steps are simplified to reduce the manufacturing cost.

Furthermore, since the contact hole CH3 is formed so as not to engage the etching stopper film 4, there is no possibility that the etching stopper film 4 projects like a visor in the contact hole CH3, even when wet etching using chemicals such as hydrofluoric acid (HF) is performed to remove native oxide to be formed, after forming the contact hole CH3, on the surface of the silicon substrate 1 on the bottom surface of the contact hole CH3, and the contact hole CH3 will be expanded by this wet etching.

This eliminates the problem that when the contact hole CH3 is filled with a metal film in order to form the contact plug 61, the coverage of the metal film is lowered due to the projection of the etching stopper film 4. Therefore, malfunction in the contact plug is avoidable, thus leading to an increase in yield and a reduction in the manufacturing cost.

B. Second Preferred Embodiment

B-1. Manufacturing Method

A semiconductor device manufacturing method according to a second preferred embodiment will be described by using FIGS. 9 to 15, which are sectional views showing a sequence of manufacturing steps of a DRAM 200 having a cylindrical capacitor. FIGS. 9 to 15 merely show part of the configuration of the DRAM 200, and the number of the individual elements etc. are not to be construed as a limiting value.

Figure 13:
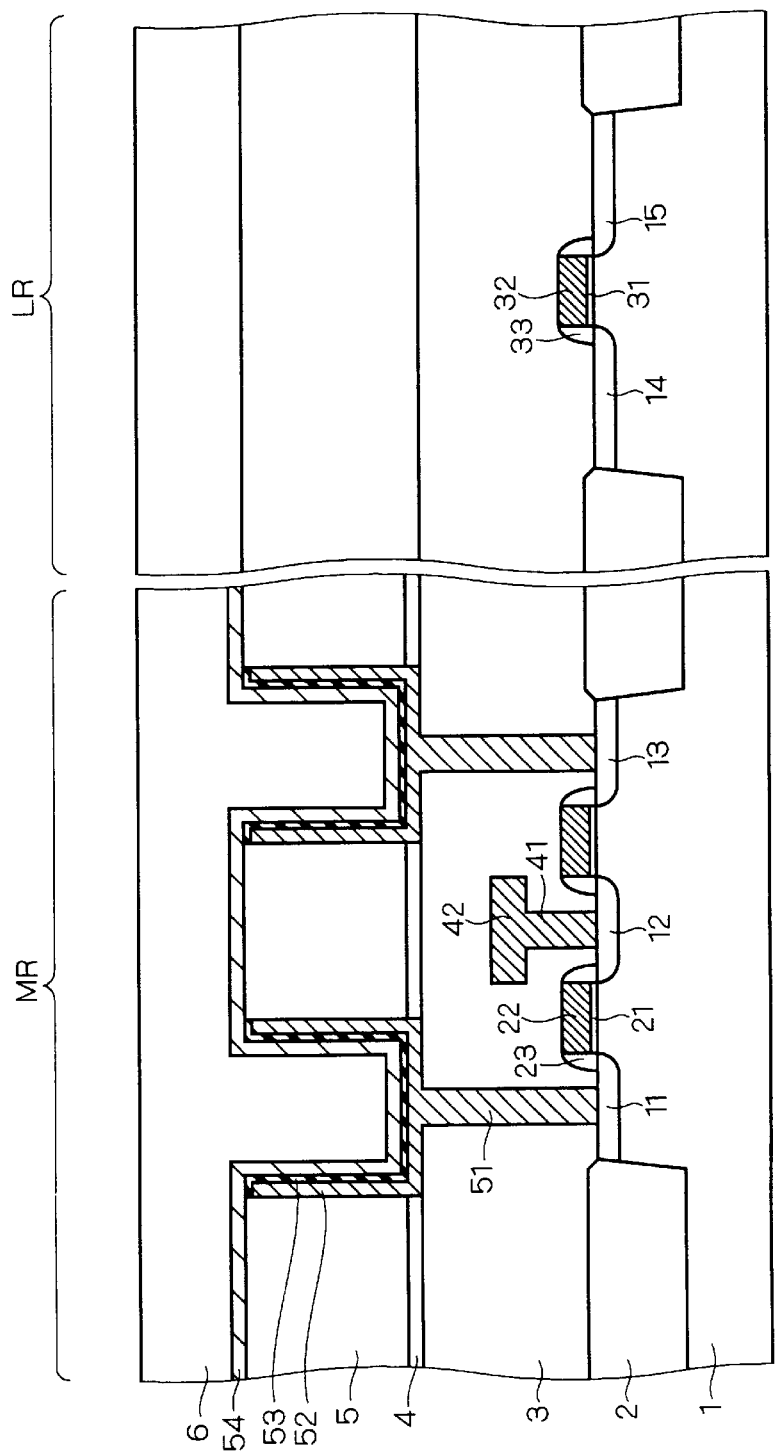
Figure 14:
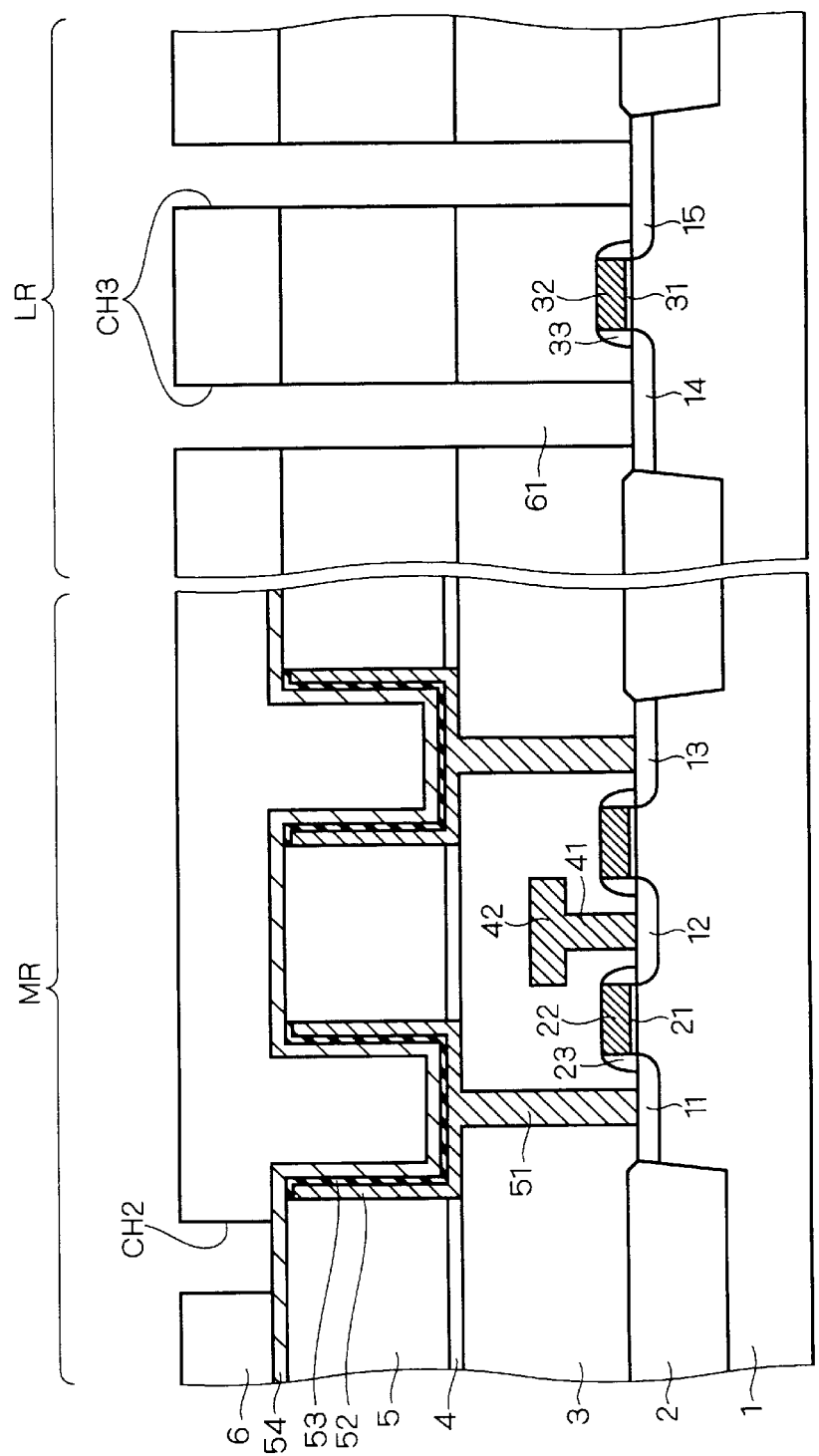
Figure 15:
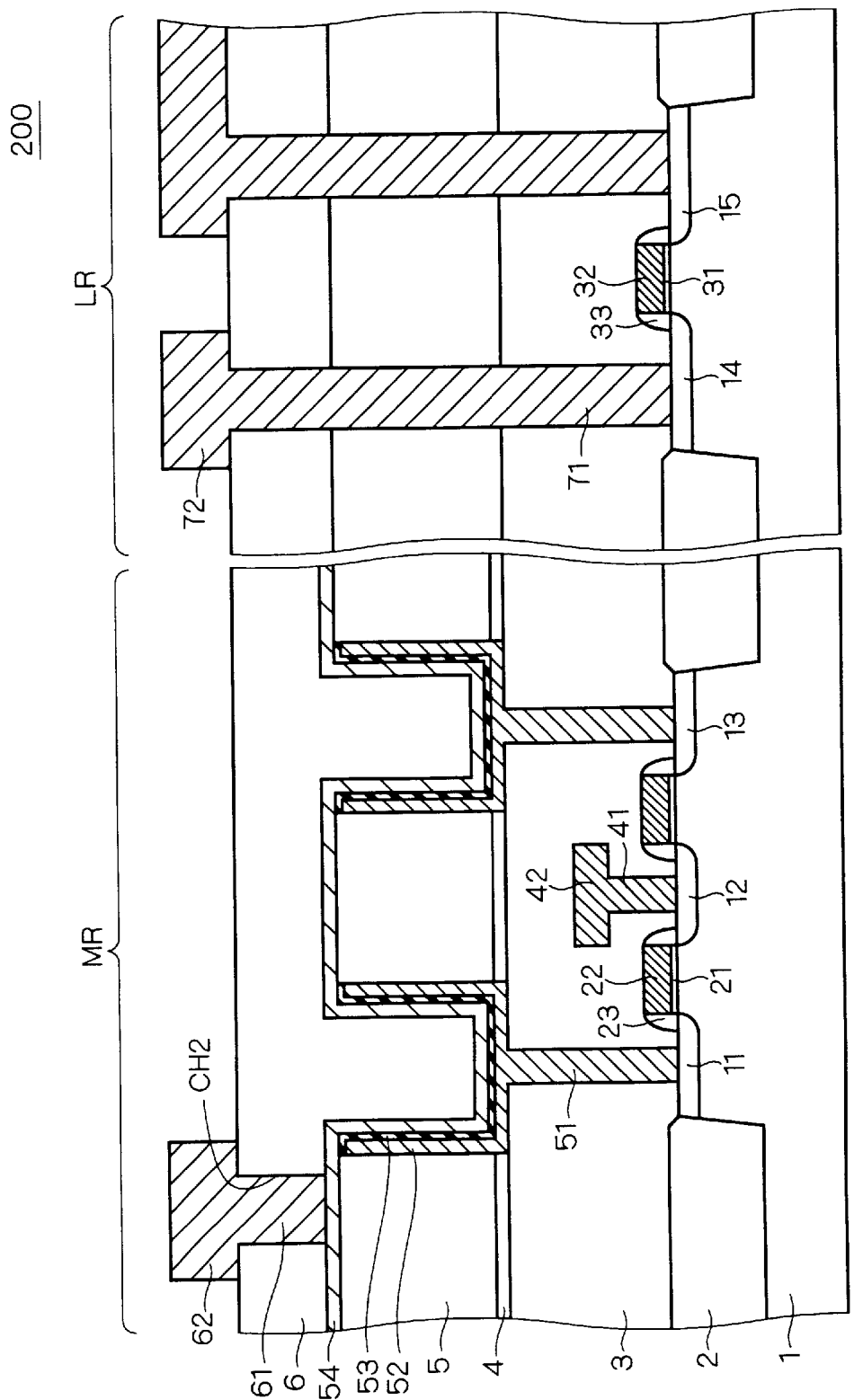
Figure 16:
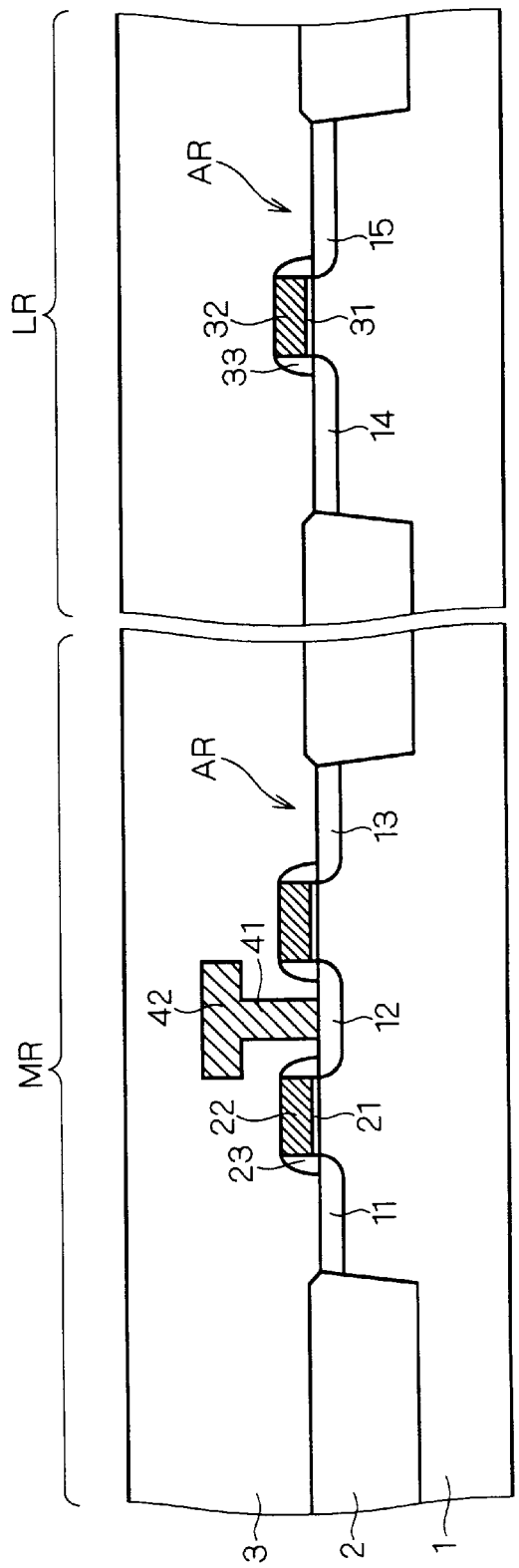
FIGS. 16 to 24 are sectional views illustrating a conventional sequence of semiconductor device manufacturing steps.
Figure 17:
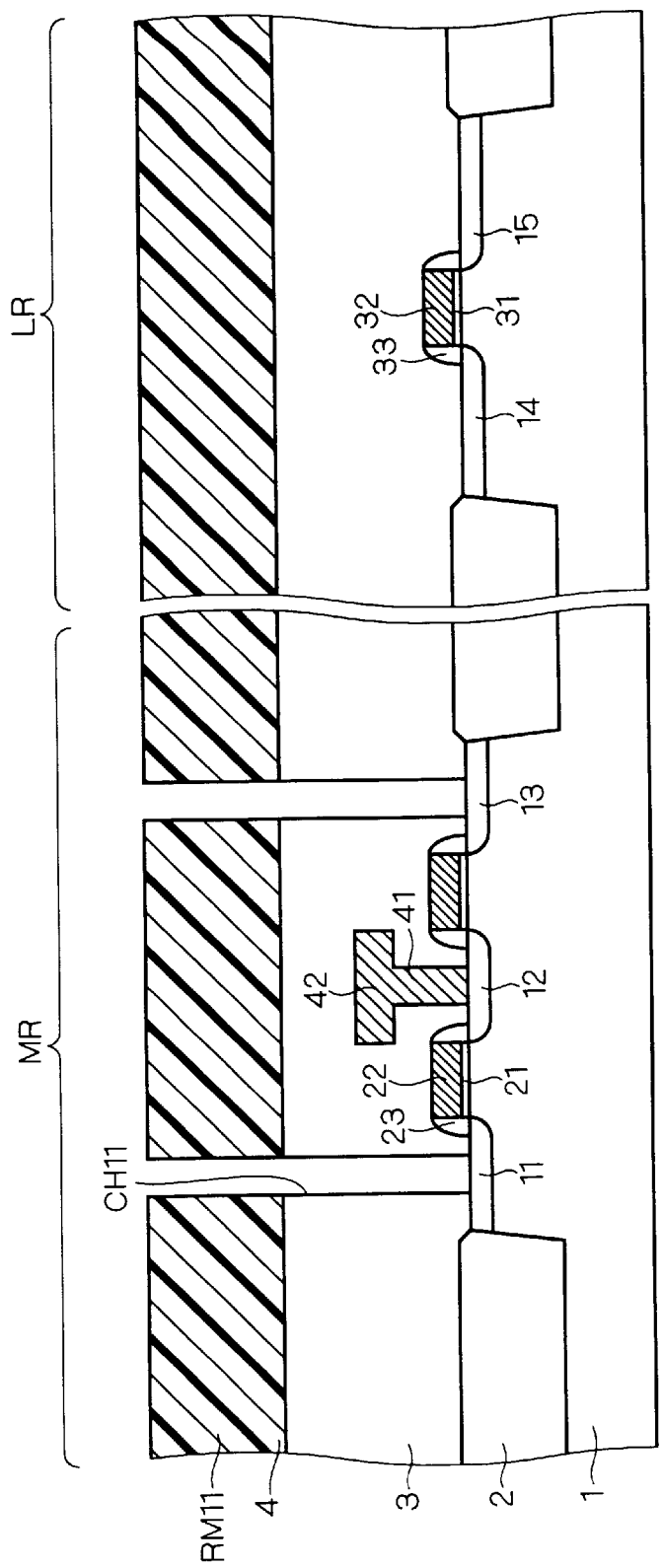
Figure 18:
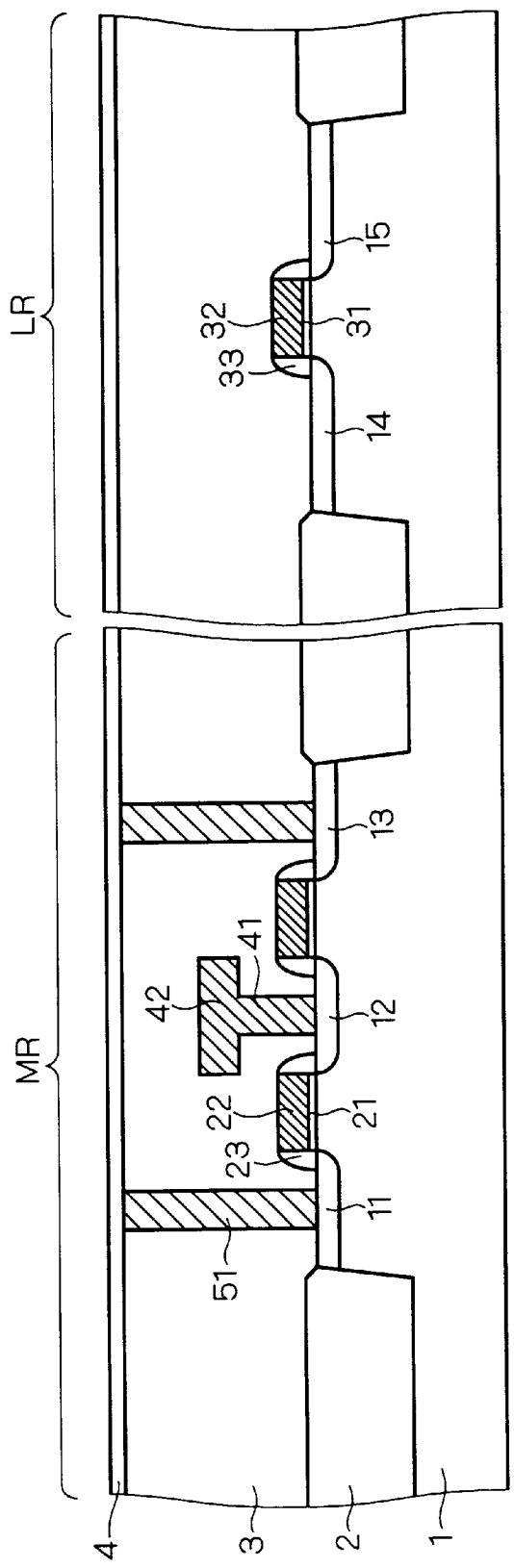
Figure 19:
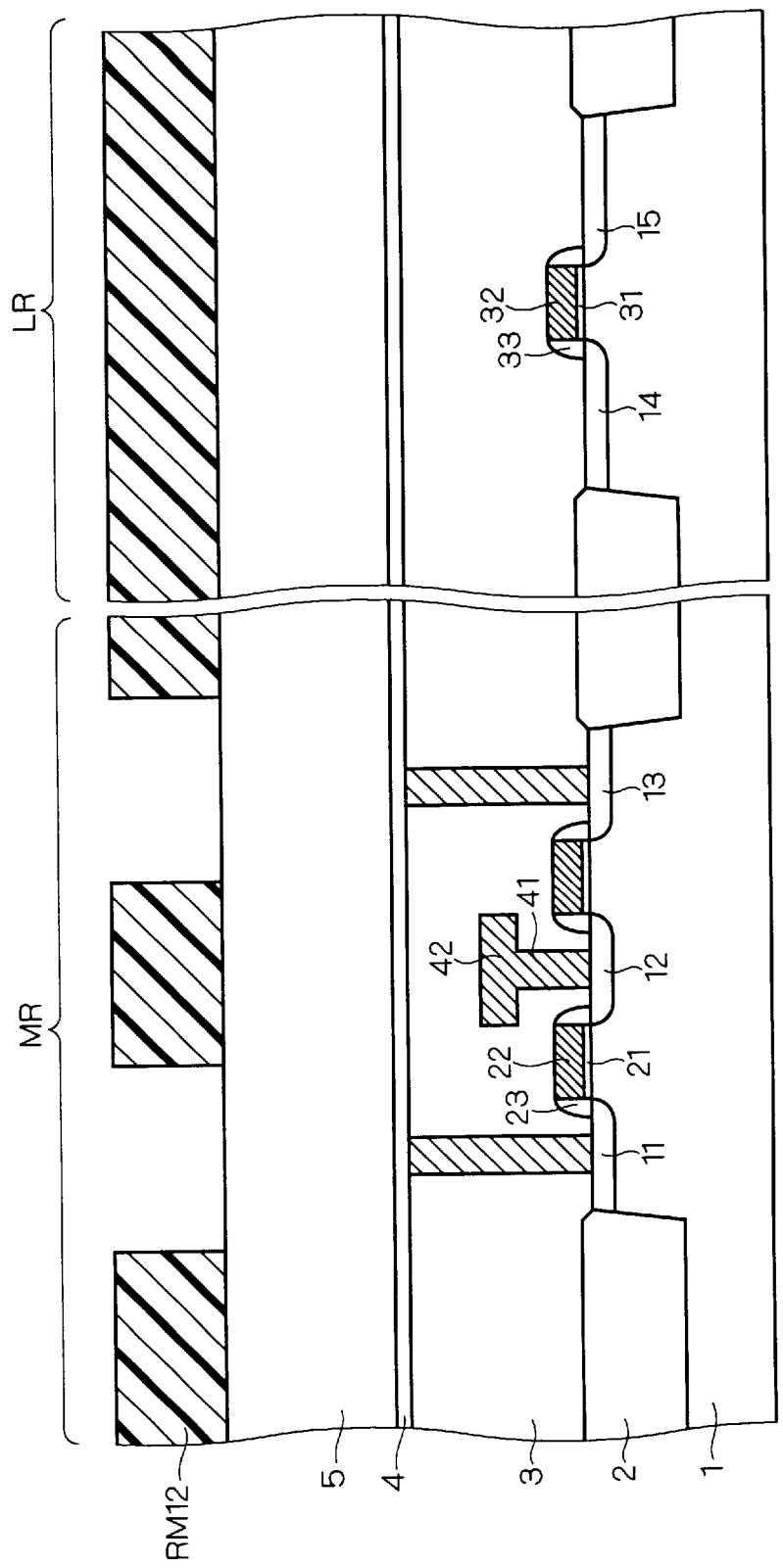
Figure 20:
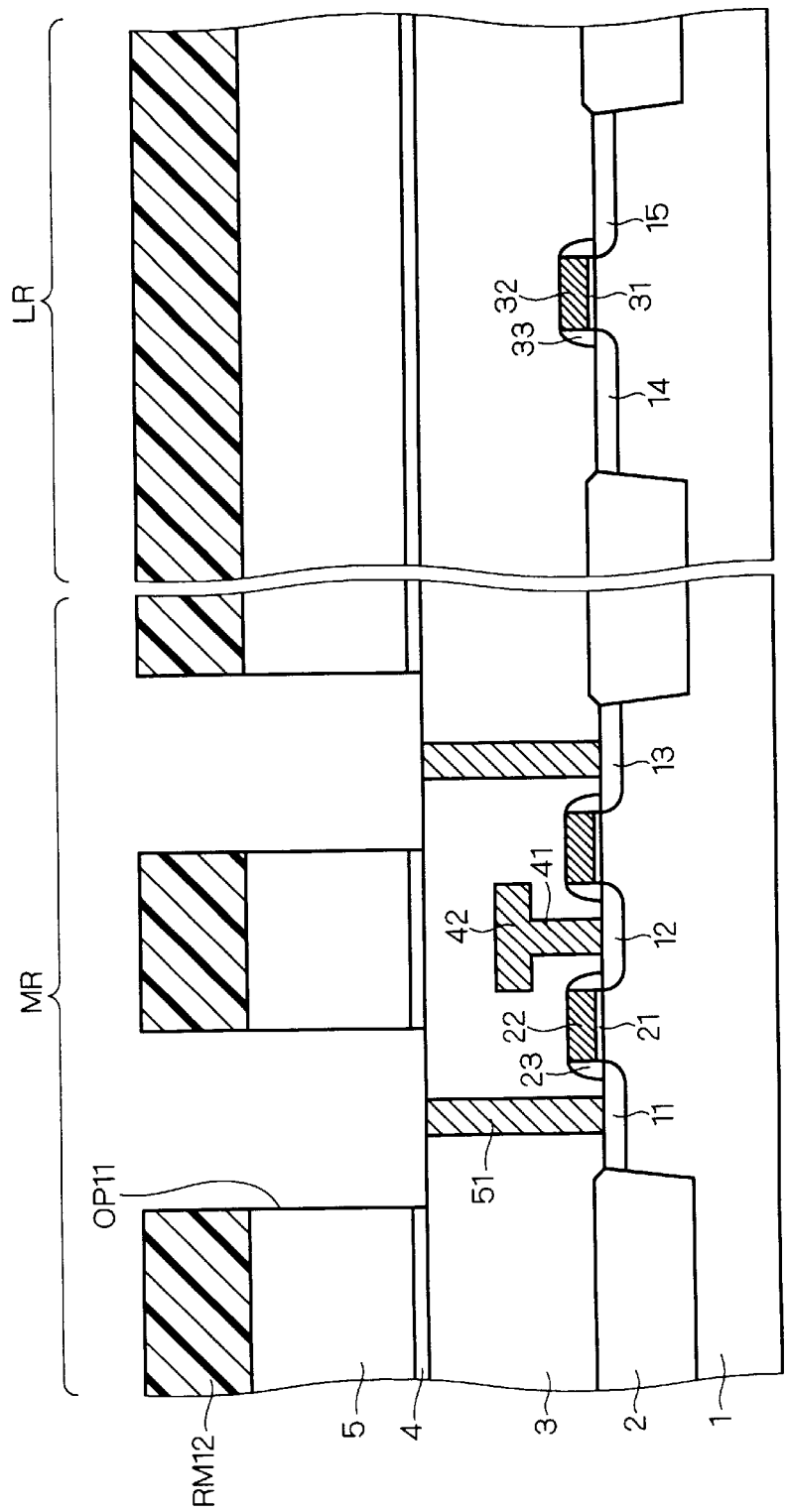
Figure 21:
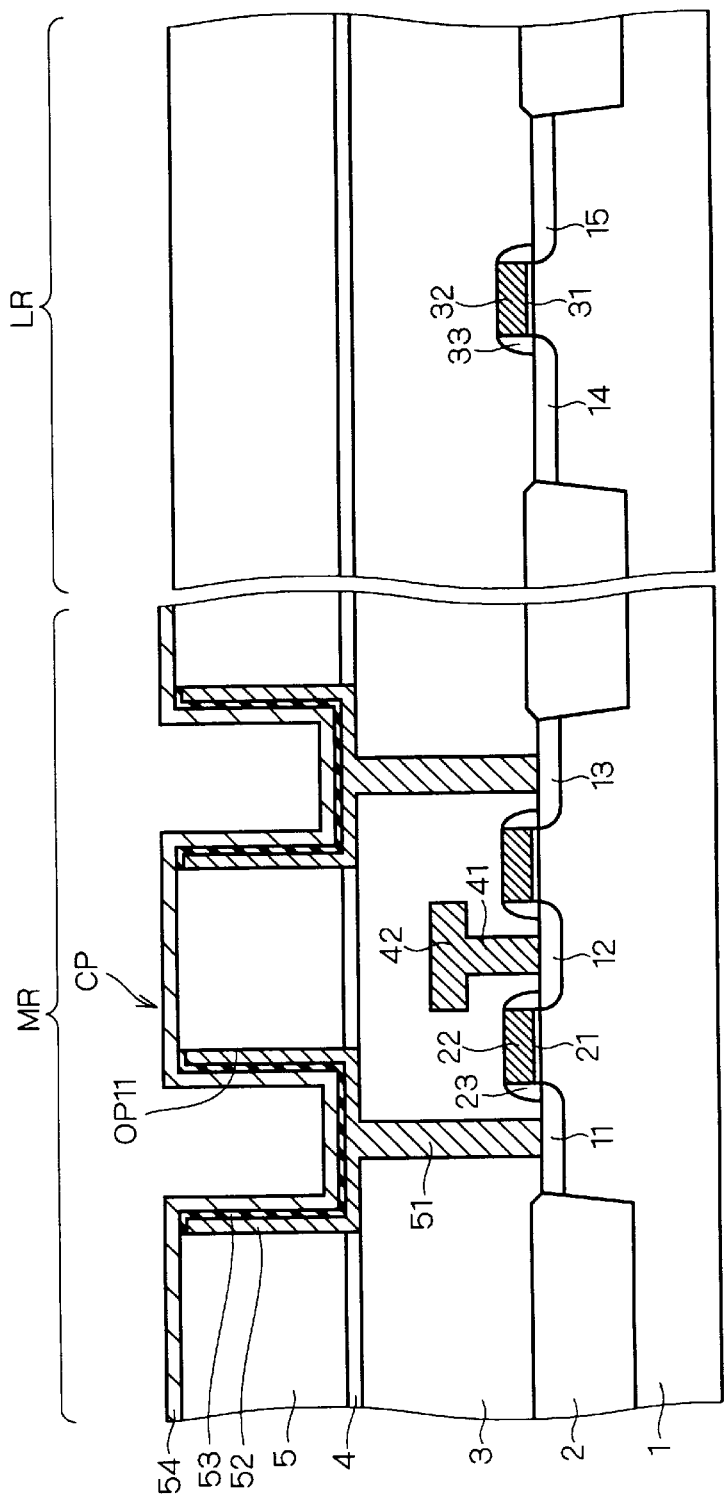
Figure 22:
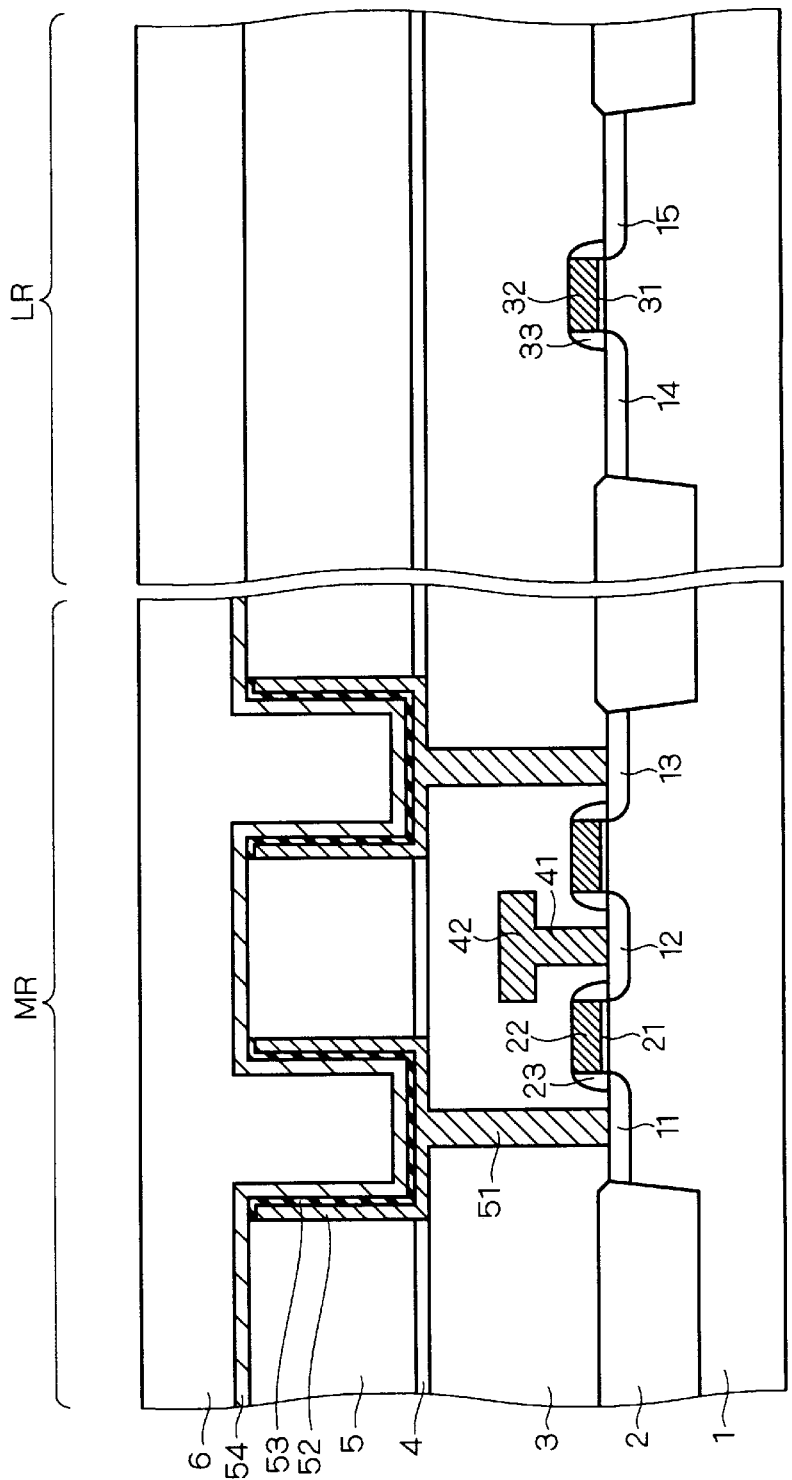
Figure 23:
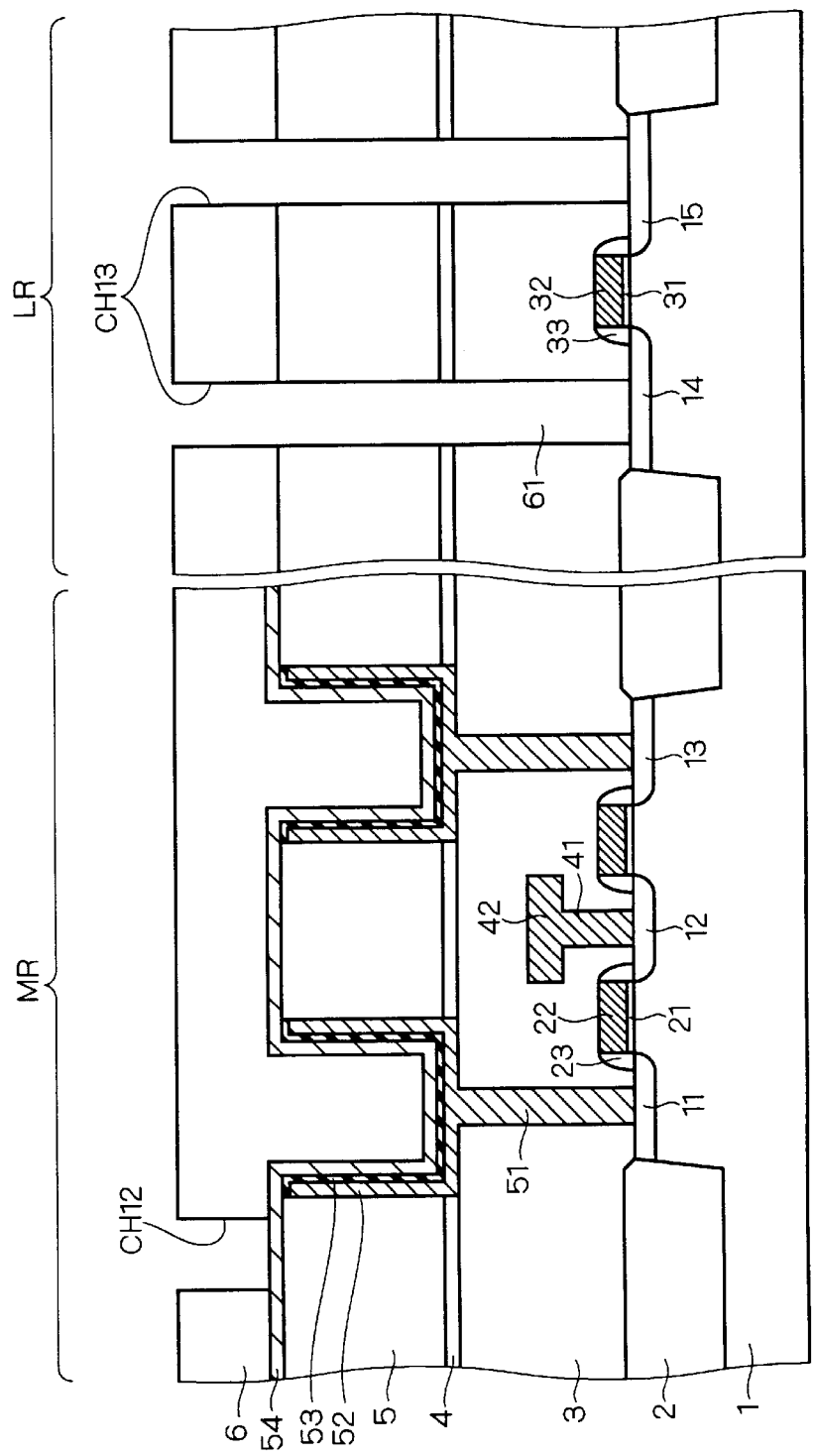
Figure 24:
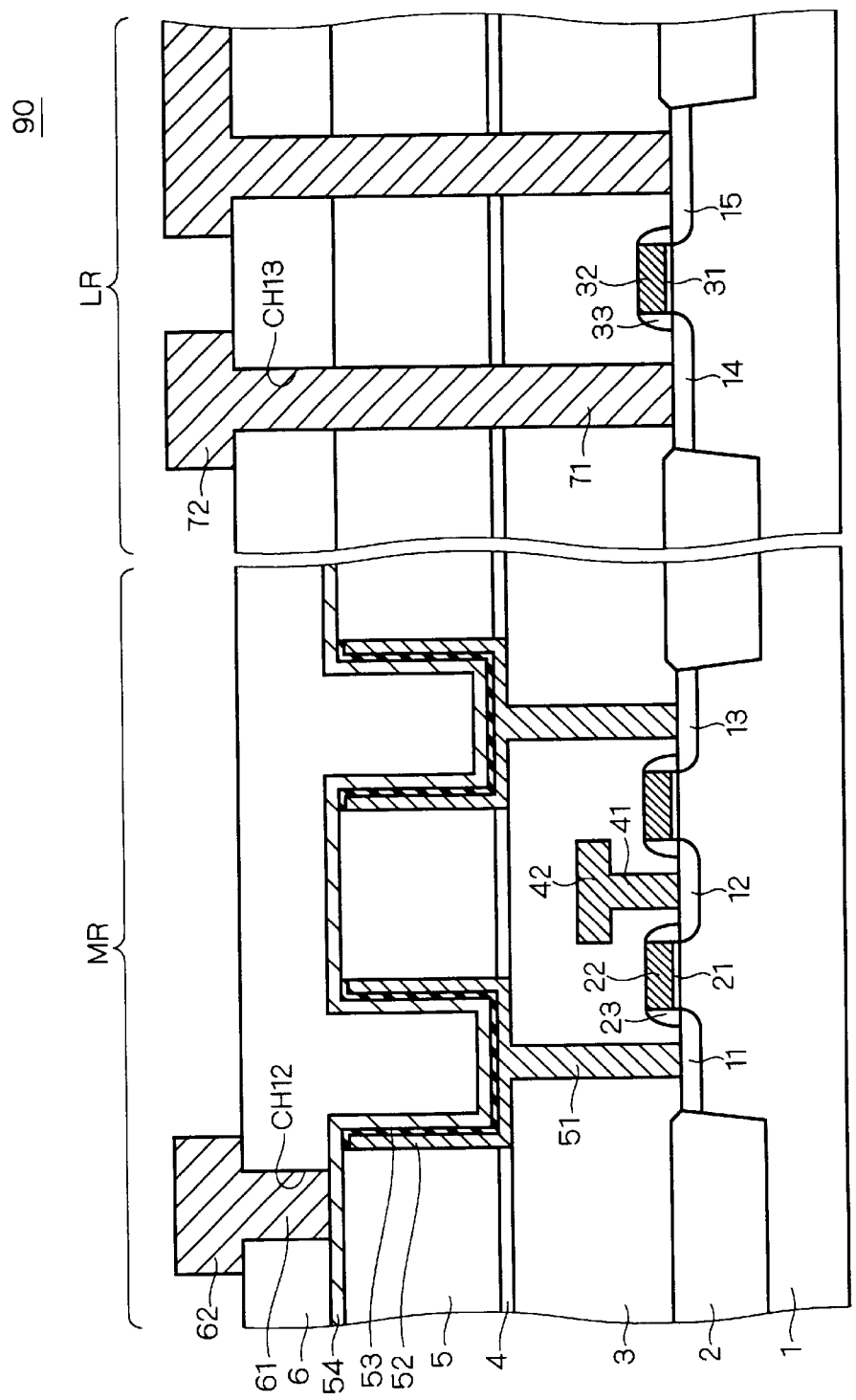
Figure 25:
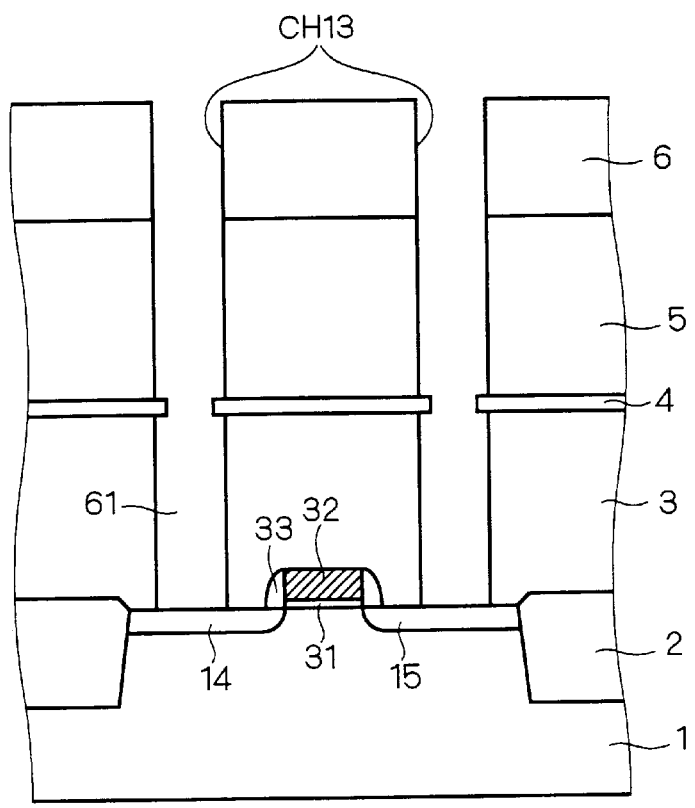
FIGS. 25 and 26 are diagrams illustrating a problem in a conventional semiconductor device manufacturing.
Figure 26:
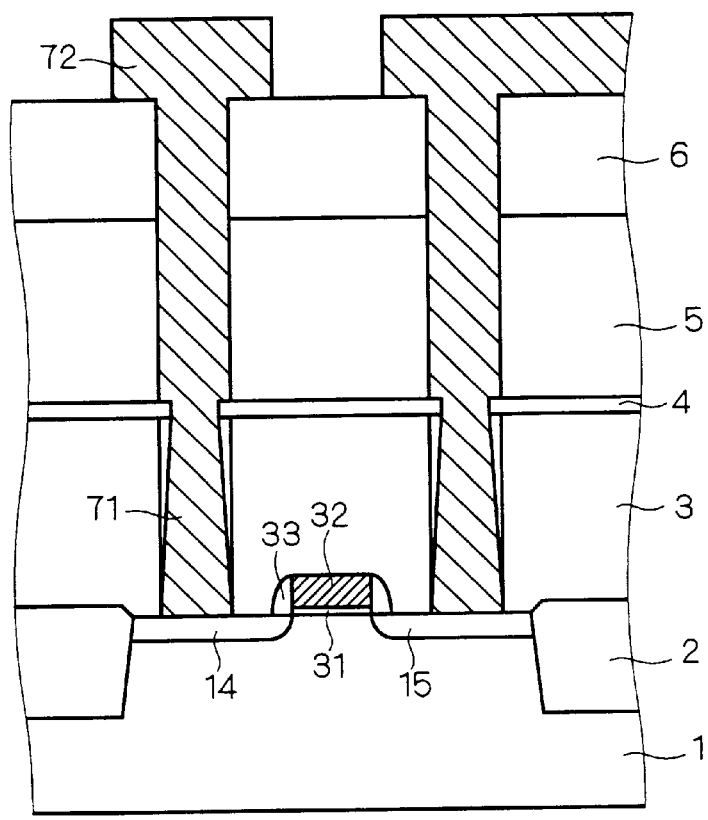

Specifically, FIGS. 9 to 15 are partial sectional views showing the DRAM 200 having a memory cell region MR, and a peripheral circuit region LR that is formed in the periphery of the memory cell region MR and does not have any capacitor such as a logic circuit, sense amplifier, and decoder. The final configuration of the DRAM 200 is given in FIG. 15 showing the final step.

Figure 9:
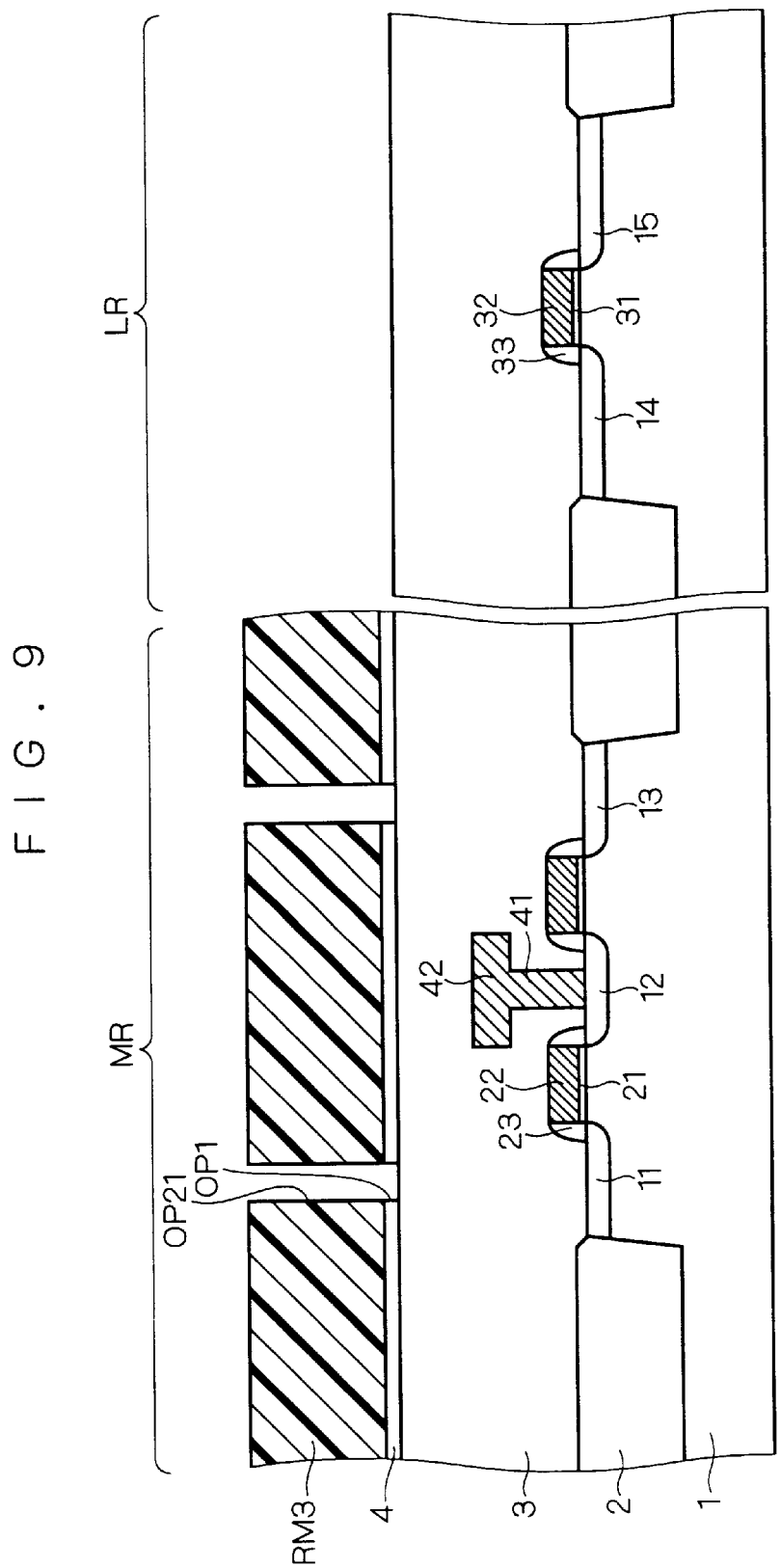
FIGS. 9 to 15 are sectional views illustrating a sequence of semiconductor device manufacturing steps according to a second preferred embodiment of the present invention.

The manufacturing steps up to the configuration that a plurality of MOS transistors are formed, as shown in FIG. 9, are the same as that in the first preferred embodiment described in connection with FIG. 1, and their descriptions are omitted here. In the following, similar reference numerals have been used to denote similar parts as in the configuration of the DRAM 100 of the first preferred embodiment, and the overlapped description is omitted here.

After passing through the step described in connection with FIG. 1, an interlayer film 3 is formed over a silicon substrate 1 on which a plurality of MOS transistors are formed. Then, in the step of FIG. 9, an etching stopper film 4 is formed, such as by the use of a silicon nitride film, on the entire surface of the interlayer insulating film 3.

Thereafter, a resist is applied to the entire surface of the etching stopper film 4, and photolithography technique is employed to form a resist pattern for forming a contact plug in the memory cell region MR. On the other hand, a resist pattern is not formed in the peripheral circuit region LR.

The resist pattern in the memory cell region MR is formed so as to have an opening OP21 of which opening area is approximately the same as the sectional area of the actually formed contact plug.

An anisotropic dry etching using the resist mask RM3 is performed such that the etching stopper film 4 is selectively removed, an opening OP1 is formed in the memory cell region MR, and the etching stopper film 4 overlying the interlaying insulating film 3 is completely removed in the peripheral circuit region LR.

The opening OP1 is disposed so as to correspond to a region for forming a contact hole that reaches source/drain regions 11 and 13 to be formed in a later step.

Figure 10:
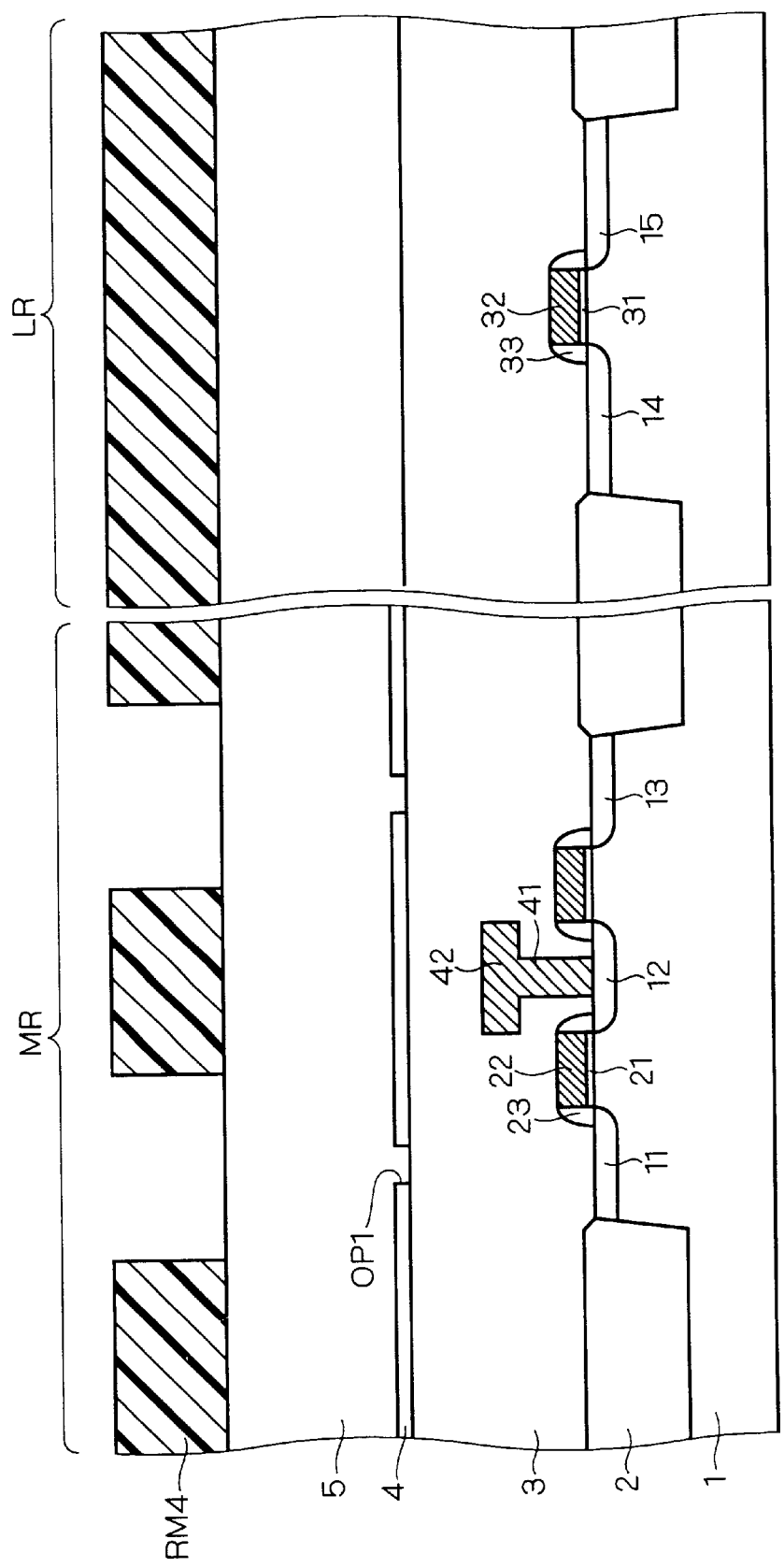

The resist mask RM3 is then removed. In the step of FIG. 10, an interlayer insulating film 5 is formed, such as by the use of a silicon oxide film, on the entire surface of the memory cell region MR and peripheral circuit region LR, for example by CVD method.

Thereafter, a resist is applied to the entire surface of the interlayer insulating film 5, and a resist pattern for forming a capacitor is transferred to form a resist mask RM4 by photolithography technique. This resist pattern has such a pattern that is opened at a portion corresponding to above of the opening OP1 disposed in the etching stopper film 4.

Figure 11:
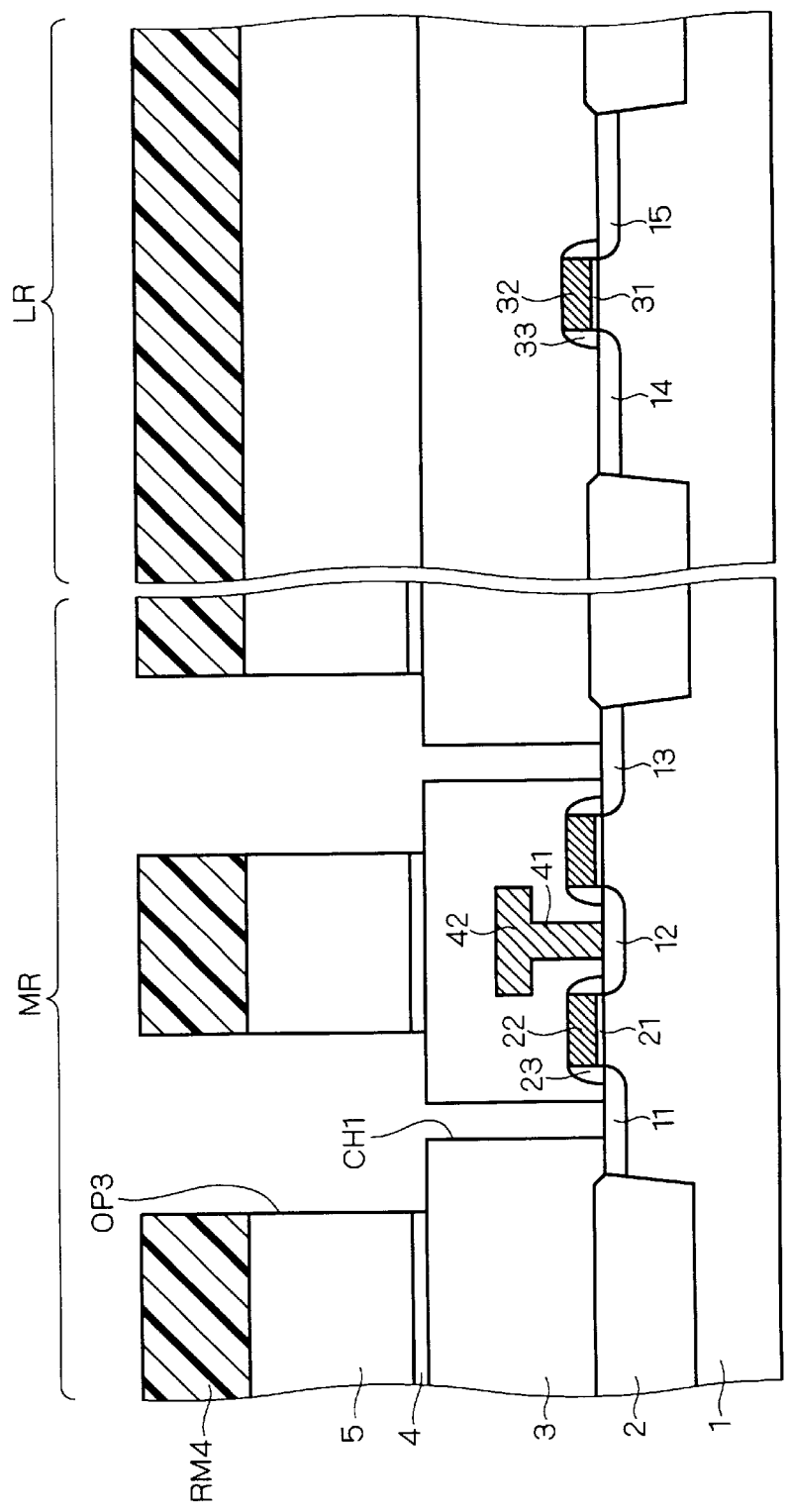

In the step of FIG. 11, an anisotropic dry etching using the resist mask RM4 is performed to form an opening OP3 extending through at least the interlayer insulating film 5. Even after the etching stopper film 4 is exposed to the bottom part of the opening OP3, the anisotropic dry etching is continued to apply the etching to the interlayer insulating film 3 underlying the opening OP1 disposed in the etching stopper film 4.

That is, the contact hole CH1 extending through the interlayer insulating film 3 to the source/drain regions 11 and 13 is formed by using the etching stopper film 4 as etching mask.

Figure 12:
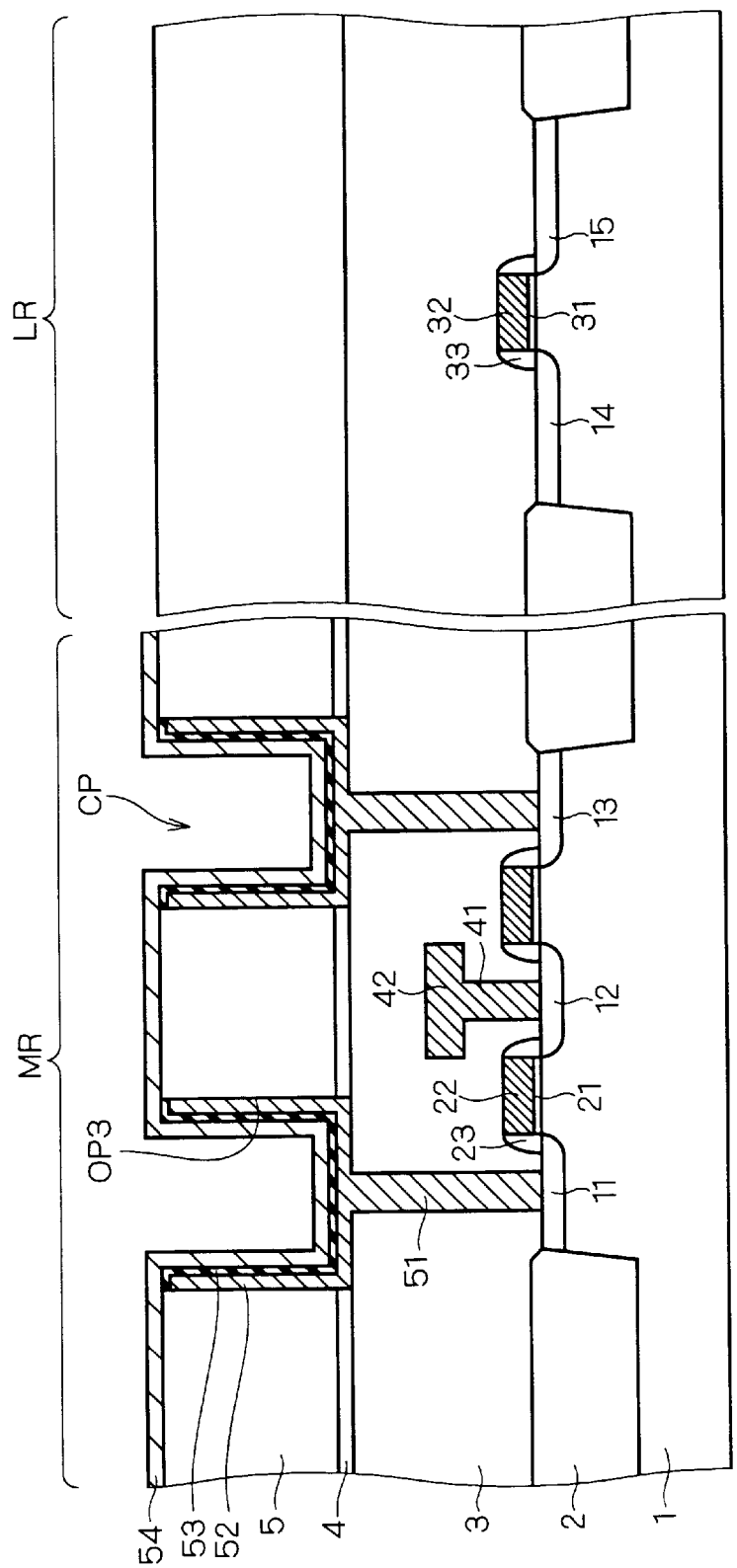

The resist mask RM4 is then removed. In the step of FIG. 12, for example by CVD method, a polysilicon film is formed so as to cover the inner wall of the opening OP3 and fill in the contact hole CH1. At the same time a capacitor lower electrode 52 is formed, there is formed a contact plug 51 that electrically connects the capacitor lower electrode 52 and the source/drain regions 11, 13.

A capacitor dielectric film 53 is formed along the surface of the capacitor lower electrode 52. Further, a capacitor upper electrode 54 is formed by forming for example a polysilicon film extending from the surface of the capacitor dielectric film 53 to above the interlayer insulating film 5 around the opening OP11. As the result, a cylindrical capacitor CP is formed in the memory cell region MR.

In the step of FIG. 13, an interlayer insulating film 6 is formed, such as by the use of a silicon oxide film, on the entire surface of the memory cell region MR and peripheral circuit region LR. For example by CMP method, planarization is performed such that the main surface of the interlayer insulating film 6 is located at the same height between the memory cell region MR and peripheral circuit region LR.

In the step of FIG. 14, in the memory cell region MR, an anisotropic dry etching is performed to form a contact hole CH2 extending through the interlayer insulating film 6 to the capacitor upper electrode 54 overlying the interlayer insulating film 5. In the peripheral circuit region LR, an anisotropic dry etching is performed to form a contact hole CH3 extending through the interlayer insulating films 6, 5, and 3 to the source/drain regions 14 and 15.

The contact hole CH3 is disposed at a portion corresponding to the opening OP2 of the etching stopper film 4. In addition, the etching stopper film 4 is removed from the peripheral circuit region LR, as described above. Therefore, when forming the contact hole CH3, it is unnecessary to etch the etching stopper film 4, and only the interlayer insulating films 6, 5, and 3, being silicon oxide film, are subjected to etching. This eliminates the operation of changing etching conditions on the way.

In the step of FIG. 15, for example by sputtering method, the contact holes CH2 and CH3 are filled with a conductive film such as a metal film (a multilayer film consisting of a barrier metal film, such as by the use of TiN, and a tungsten film), thereby forming contact plugs 61 and 71, respectively. The DRAM 200 is obtained by patterning metal wiring layers 62 and 72 such that they are connected to the contact plugs 61 and 71, respectively.

Although an interlayer insulating film and wiring layer may be further disposed on the interlayer insulating film 6 in some cases, their depict and description are omitted here.

B-2. Operations and Effects

As stated above, with the manufacturing method of the second preferred embodiment, the contact hole CH1 for forming the contact plug 51 and the opening OP1 for forming the capacitor CP in the memory-cell region MR can be formed by performing photolithography two times and anisotropic etching two times. In addition, the contact plug 51 and capacitor lower electrode 52 can be formed in one film formation process by CVD method. Thereby, the manufacturing steps are considerably simplified to reduce the manufacturing cost.

Further, the etching stopper film 4 is removed from the peripheral circuit region LR. Therefore, when forming the contact hole CH3 in the peripheral circuit region LR, it is unnecessary to etch the etching stopper film 4, and only the interlayer insulating films 6, 5, and 3, being silicon oxide film, are subjected to etching. This eliminates the operation of changing etching conditions on the way, so that the manufacturing steps are simplified to reduce the manufacturing cost.

Furthermore, since the contact hole CH3 does not engage the etching stopper film 4, there is no problem that when the contact hole CH3 is filled with a metal film in order to form the contact plug 61, the coverage of the metal film is lowered due to the projection of the etching stopper film 4. Therefore, malfunction in the contact plug is avoidable, thus leading to an increase in yield and a reduction in the manufacturing cost.

Additionally, the pattern shape of the resist mask RM3 for forming the etching stopper film 4 is simplified, so that the number of elements to be aligned is reduced to simplify the manufacturing steps. Also, the transfer mask for forming the resist mask RM3 has a simple pattern to reduce the manufacturing cost.

C. Modifications

In the foregoing first and second preferred embodiments, the contact hole CH3 that reaches the source/drain regions 14 and 15 in the peripheral circuit region LR is taken as example to describe the configuration that the contact hole CH3 does not engage the etching stopper film 4. The same configuration is applicable to any contact hole connecting upper and lower layer configurations of an etching stopper film, in order to prevent the contact hole from engaging the etching stopper film.

In the foregoing description, the DRAM is taken as example, and the peripheral circuit region LR is taken as a region having no capacitor. The region having no capacitor should not be limited thereto. For example, in a semiconductor device having a DRAM, the present invention may be applied to the memory cell region and any circuit region other than the DRAM.

Although the first and second preferred embodiments are directed to the semiconductor device that includes the region having the capacitor and the region having no capacitor, the present invention is also effective in a semiconductor device having, on the same semiconductor substrate, a region that requires an etching stopper film for forming the configuration of the region, and a region requiring no etching stopper film.

Although the first and second preferred embodiments are directed to the configuration that the contact plugs 51 and 71 are directly connected to the silicon substrate 1, the present invention is suitably applicable to such a configuration that the contact plugs 51 and 71 are connected to a plug directly connected to the silicon substrate and are electrically connected via the plug to the silicon substrate 1.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device of a multilayer structure that includes a circuit region having a capacitor, said method comprising the steps of:

(a) forming a first interlayer insulting film on a semiconductor substrate;

(b) forming an etching stopper film on the entire surface of said first interlayer insulating film;

(c) patterning, in said circuit region having said capacitor, said etching stopper film so as to have a first opening with an opening area that is approximately the same as the sectional area of a first contact plug electrically connecting a lower electrode of said capacitor and the configuration of a lower layer with respect to said etching stopper film;

(d) forming a second interlayer insulating film on said etching stopper film;

(e) forming at a same time, in said circuit region having said capacitor, a capacitor opening for defining the contour of said capacitor and a first contact hole for forming said first contact plug by removing, by an anisotropic dry etching, a predetermined region of said second interlayer insulating film including above said first opening until said etching stopper film is exposed, and continuing said etching to remove said first interlayer insulating film below said first opening; and (f) forming said capacitor in said capacitor opening, wherein step (e) includes the step of forming said capacitor opening so that a surface of said first interlayer insulating film is exposed at a bottom surface of said capacitor opening;

wherein said step (f) includes the step of forming said first contact plus at a same time as said lower electrode is formed by forming a conductive film so as to cover the inner wall of said capacitor opening and to completely fill in said first contact hole.

2. The method according to claim 1 wherein said step (f) includes the step of forming a capacitor dielectric film along the surface of said lower electrode and then forming an upper electrode extending from the surface of said capacitor dielectric film to the surface of said second interlayer insulating film around said capacitor opening.

3. The method according to claim 1 wherein said semiconductor device further has on said semiconductor substrate a circuit region not having said capacitor, and said step (c) includes the step of patterning said etching stopper film so as to have a second opening with an opening area that is larger than the sectional area of a second contact plug electrically connecting upper and lower layer configurations with respect to said etching stopper film, said method further comprising, after said step (f), the steps of:

(g) disposing a second contact hole for forming said second contact plug at portions of said first and second interlayer insulating films which correspond to a region where said second opening is disposed; and (h) forming said second contact plug by forming a conductive film so as to fill in said second contact hole.

4. The method according to claim 1 wherein said semiconductor device further has on said semiconductor substrate a circuit region not having said capacitor, and said step (c) includes the step of completely removing said etching stopper film in said circuit region not having said capacitor, said method further comprising, after said step (f), the steps of:

(g) disposing a second contact hole for forming said second contact plug in said first and second interlayer insulating films; and (h) forming said second contact plug by forming a conductive film so as to fill in said second contact hole.

5. The method according to claim 1 wherein said step (a) includes the step of forming said first interlayer insulating film by a silicon oxide film, said step (b) includes the step of forming said etching stopper film by a silicon nitride film, and said step (d) includes the step of forming said second interlayer insulating film by a silicon oxide film.

6. A method of manufacturing a semiconductor device of a multilayer structure that includes a circuit region having a capacitor, said method comprising the steps of:

(a) forming a first interlayer insulting film on a semiconductor substrate;

(b) forming an etching stopper film on the entire surface of said first interlayer insulating film;

(c) patterning, in said circuit region having said capacitor, said etching stopper film so as to have a first opening with an opening area that is approximately the same as the sectional area of a first contact plug electrically connecting a lower electrode of said capacitor and the configuration of a lower layer than said etching stopper film;

(d) forming a second interlayer insulating film on said etching stopper film;

(e) forming at a time, in said circuit region having said capacitor, a capacitor opening for defining the contour of said capacitor and a first contact hole for forming said first contact plug by removing, by an anisotropic dry etching, a predetermined region of said second interlayer insulating film including above said first opening until said etching stopper film is exposed, and continuing said etching to remove said first interlayer insulating film below said first opening; and (f) forming said capacitor in said capacitor opening, wherein said semiconductor device further has on said semiconductor substrate a circuit region not having said capacitor, and said step (c) includes the step of patterning said etching stopper film so as to have a second opening with an opening area that is larger than the sectional area of a second contact plug electrically connecting upper and lower layer configurations, said method further comprising, after said step (f), the steps of:

(g) disposing a second contact hole for forming said second contact plug at portions of said first and second interlayer insulating films which correspond to a region where said second opening is disposed; and (h) forming said second contact plug by forming a conductive film so as to fill in said second contact hole.

7. A method of manufacturing a semiconductor device of a multilayer structure that includes a circuit region having a capacitor, said method comprising the steps of:

(a) forming a first interlayer insulting film on a semiconductor substrate;

(b) forming an etching stopper film on the entire surface of said first interlayer insulating film;

(c) patterning, in said circuit region having said capacitor, said etching stopper film so as to have a first opening with an opening area that is approximately the same as the sectional area of a first contact plug electrically connecting a lower electrode of said capacitor and the configuration of a lower layer than said etching stopper film;

(d) forming a second interlayer insulating film on said etching stopper film;

(e) forming at a time, in said circuit region having said capacitor, a capacitor opening for defining the contour of said capacitor and a first contact hole for forming said first contact plug by removing, by an anisotropic dry etching, a predetermined region of said second interlayer insulating film including above said first opening until said etching stopper film is exposed, and continuing said etching to remove said first interlayer insulating film below said first opening; and (f) forming said capacitor in said capacitor opening, wherein said semiconductor device further has on said semiconductor substrate a circuit region not having said capacitor, and said step (c) includes the step of completely removing said etching stopper film in said circuit region not having said capacitor, said method further comprising, after said step (f), the steps of:

(g) disposing a second contact hole for forming said second contact plug in said first and second interlayer insulating films; and (h) forming said second contact plug by forming a conductive film so as to fill in said second contact hole.

* * * * *